(12) United States Patent
Taoka

(10) Patent No.: US 8,930,857 B2
(45) Date of Patent: Jan. 6, 2015

(54) MASK DATA VERIFICATION APPARATUS, DESIGN LAYOUT VERIFICATION APPARATUS, METHOD THEREOF, AND COMPUTER PROGRAM THEREOF

(75) Inventor: Hironobu Taoka, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/491,082

(22) Filed: Jun. 7, 2012

(65) Prior Publication Data
US 2012/0317524 A1 Dec. 13, 2012

(30) Foreign Application Priority Data

Jun. 10, 2011 (JP) ................. 2011-130517

(51) Int. Cl.
G06F 17/50 (2006.01)
G03F 1/36 (2012.01)
G03F 1/70 (2012.01)

(52) U.S. Cl.
CPC .. G03F 1/36 (2013.01); G03F 1/70 (2013.01); G06F 17/5081 (2013.01)
USPC .......................................................... 716/53

(58) Field of Classification Search
USPC .................................................. 716/100, 53
See application file for complete search history.

(56) References Cited

U.S. PATENT DOCUMENTS

| | | | |
|---|---|---|---|
| 5,847,421 A | 12/1998 | Yamaguchi | |
| 6,343,370 B1 | 1/2002 | Taoka et al. | |
| 7,673,278 B2 * | 3/2010 | Rathsack et al. | 716/56 |
| 7,765,515 B2 * | 7/2010 | Ying | 716/52 |
| 7,818,707 B1 * | 10/2010 | Gennari et al. | 716/53 |
| 2001/0049811 A1 | 12/2001 | Taoka | |
| 2005/0188338 A1 * | 8/2005 | Kroyan et al. | 716/9 |
| 2008/0189673 A1 * | 8/2008 | Ying | 716/21 |
| 2009/0144691 A1 * | 6/2009 | Rathsack et al. | 716/19 |
| 2010/0180253 A1 * | 7/2010 | Ying | 716/21 |
| 2010/0242011 A1 | 9/2010 | Mukai et al. | |

FOREIGN PATENT DOCUMENTS

| | | |
|---|---|---|
| JP | 10-32253 A | 2/1998 |
| JP | 2000-182921 A | 6/2000 |
| JP | 2001-350250 A | 12/2001 |
| JP | 2010-20553 A | 1/2010 |
| WO | WO 2008/023660 A1 | 2/2008 |

OTHER PUBLICATIONS

Jae-Hyun Kang et al., Combination of Rule and Pattern Based Lithography Unfriendly Pattern Detection in OPC Flow, Proc. Of SPIE, vol. 7122, 2008, 8 pages.

* cited by examiner

*Primary Examiner* — Suchin Parihar
(74) *Attorney, Agent, or Firm* — Foley & Lardner LLP

(57) ABSTRACT

A mask data verification apparatus compares a design layout with design layout patterns stored in an existing-type library and extracts a design layout pattern found to be neither equal nor similar as a new-type design layout pattern. The mask data verification apparatus generates mask data using OPC/RET with reference to a new design layout pattern stored in a new-type library and performs post-verification. The mask data verification apparatus can previously verify a new design layout pattern, shorten a semiconductor device manufacturing period, ensure efficient development, and improve a manufacturing yield.

12 Claims, 31 Drawing Sheets

MASK DATA VERIFICATION APPARATUS, DESIGN LAYOUT VERIFICATION APPARATUS, METHOD THEREOF, AND COMPUTER PROGRAM THEREOF

CROSS-REFERENCE TO RELATED APPLICATIONS

The disclosure of Japanese Patent Application No. 2011-130517 filed on Jun. 10, 2011 including the specification, drawings and abstract is incorporated herein by reference in its entirety.

BACKGROUND

The present invention relates to a mask data verification apparatus creating and verifying mask data from a design layout, a design layout verification apparatus verifying a design layout generated from a logic circuit, a method thereof, and a computer program thereof.

Recently, vertically integrated semiconductor manufacturers as well as fabless companies come to utilize foundries in the manufacturing field in order to suppress investment costs for development and manufacture of advanced processes. Exchanging useful information with each other is important to utilize foundries.

On the other hand, semiconductor devices are increasingly requested to be highly functional and versatile. Processes are refined accordingly. A process node finer than 180 nm must use the OPC (Optical Proximity Correction). The OPC deforms a photomask shape and thereby corrects the pattern shape formed on a wafer. The result directly affects manufacturing yield.

The OPC may be considered a function that uses a design layout as input and a photomask shape as output. While various types of design layouts are available, the function specification (hereinafter referred to as OPC specification) is optimized for a set of design layouts that may be input candidates. That is, a manufacturing party (such as foundry) awaits a design layout supplied from a designing party. The design layout contains an OPC specification previously optimized for a set of design layouts expected in the manufacturer.

There may be a case where a design layout unexpected in the manufacturing party is supplied from the designing party and is likely to affect manufacturing yield. In such a case, the manufacturing party reviews the OPC specification. During the verification, the manufacturing party searches for an optimal specification, examines an adverse effect on the other design layouts due to specification changes, and finally re-processes normal OPC and post-OPC verification.

The OPC process and the verification of its result are time-consuming. If a problem occurs, a general solution may be to postpone the manufacturing plan and refine the OPC specification or to tolerate a decrease in the manufacturing yield and keep the OPC specification unchanged.

A recent trend is to shorten the life cycle of final products using semiconductor devices. There is a demand to shorten a period from supply of a design layout from the designing party to completion of the semiconductor device manufacturing.

To manufacture semiconductor devices, the manufacturing party is supplied with a design layout from the designing party and performs OPC processes, photomask fabrication, wafer fabrication, inspection, and mounting. A considerable business loss might result from depending on the design layout and frequently revising the OPC specification. The related technologies are disclosed in patent documents 1 through 5 and non-patent document 1.

Patent document 1 aims at providing a semiconductor device, a basic cell library, a method of manufacturing the semiconductor device, a method of forming the basic cell library, and a mask in order to be able to decrease the amount of polydata corrected by the OPC, shorten the CAD processing time, perform the OPC on each cell, and shorten the turnaround time for products. A dummy wiring pattern is previously formed around a basic cell stored in the basic cell library. It is necessary to settle a distance between a polysilicon gate used for circuits in the basic cell and polysilicon wiring for the dummy wiring pattern adjacent to the polysilicon gate. The distance can be settled within the cell. As a result, this enables to estimate the magnitude of poly-width variation due to the optical proximity for all the polysilicon gates in the basic cell. The OPC is performed on a mask that corrects the gate width based on the poly-width variation. An OPC value can be settled only within the cell.

Patent document 2 aims at saving time needed for an optical proximity correction (OPC) process during the mask pattern design. OPC-preprocessed cells are laid out to form a mask pattern. The correction amount of the OPC is then fine-tuned. Calculation for the fine-tuning is performed only on an overlap region between an adjustable region of each cell and surrounding regions of the other adjacent cells. This enables to decrease a range of fine-tuning an OPC diagram, that is, an area of the region that needs the calculation. A mask pattern can be designed efficiently. This enables to greatly reduce the processing time and costs for the mask pattern design.

Patent document 3 aims at estimating distortion of a pattern formed during semiconductor manufacture and detecting a portion causing pattern distortion greater than or equal to a tolerance. The semiconductor manufacture process estimates a finish pattern that is formed based on a design layout pattern. An outline of the estimated finish pattern is shaped into a polygon. An inspection reference pattern is created based on the design layout pattern. The estimated polygonal finish pattern is compared with the inspection reference pattern to detect a distortion of the estimated finish pattern. The detected pattern distortion is identified in accordance with importance degrees. In addition, the pattern contrast is verified.

Patent document 4 aims at providing a pattern distortion correction apparatus that corrects a layout pattern distortion in consideration of a process margin as well as an edge shift amount. The pattern distortion correction apparatus includes a finish pattern estimation portion, an edge shift amount measurement portion, a process margin measurement portion, a measurement result determination portion, and a layout pattern temporary-correction portion. The finish pattern estimation portion estimates a finish pattern for the layout pattern. The edge shift amount measurement portion measures an edge shift amount equivalent to a difference between the estimated finish pattern and the reference pattern. The process margin measurement portion measures a process margin for the estimated finish pattern. The measurement result determination portion determines whether the measured edge shift amount and the measured process margin satisfy determination criteria. The layout pattern temporary-correction portion corrects the layout pattern so as to satisfy the determination criteria based on a determination result from the measurement result determination portion.

Patent document 5 aims at fast and efficiently verifying conformity to intended semiconductor device layout and surrounding situations in consideration of increasing manufacture variations due to fine design patterns or high-density circuits in semiconductor integrated circuit manufacturing processes. The condition input process supplies a layout pattern division condition containing multiple specific layout patterns whose circuit characteristics need to be identical. The data division process divides input mask layout design data into multiple layout pattern groups in accordance with the layout pattern division condition. The reference pattern selection process selects a reference pattern as the pattern matching reference for each of the divided layout pattern groups. The pattern matching process compares each layout pattern in each of the layout pattern groups with the reference pattern.

Non-patent document 1 concerns the method that uses pattern matching, for example, to detect in advance a design layout pattern likely to be problematic during a manufacturing stage and corrects the design layout pattern.

Patent document 1: Japanese Unexamined Patent Publication No. Hei 10(1998)-032253
Patent document 2: WO 2008/023660
Patent document 3: Japanese Unexamined Patent Publication No. 2000-032253
Patent document 4: Japanese Unexamined Patent Publication No. 2001-182921
Patent document 5: Japanese Unexamined Patent Publication No. 2010-020553
Non-patent document 1: J. H. Kang et al., "Combination of rule and pattern based lithography unfriendly pattern detection in OPC flow", Proc. of SPIE Vol. 7122 (2008)

SUMMARY

According to a manufacturing flow of the related art, the manufacturing party predetermines a set of design layout patterns unsuitable for the manufacture and provides the designing party with the set. The designing party removes design layout patterns belonging to the set and supplies the design layout to the manufacturing party. However, it is impossible to technically predetermine all sets of design layout patterns unsuitable for the manufacture. According to this technique, the designing party might supply the manufacturing party with a design layout pattern unsuitable for the manufacture.

There may be a case where the designing party supplies a design layout pattern at the semiconductor device manufacturing stage, and the design layout pattern was unexpected at the manufacturing party and is considered to affect a manufacturing yield. Additional development period and steps are needed to prevent an adverse effect. There has been a need to make a decision on whether to postpone the manufacturing plan or permit a decrease in the manufacturing yield. Such a problem cannot be solved even through the use of the inventions disclosed in patent documents 1 through 5 or the technology disclosed in non-patent document 1.

The present invention has been made in consideration of the foregoing. It is therefore an object of the invention to provide a mask data verification apparatus, a design layout verification apparatus, a method thereof, and a computer program thereof capable of shortening a semiconductor device manufacturing period, ensuring efficient development, and improving a manufacturing yield.

According to an aspect of the present invention, there is provided a mask data verification apparatus that verifies mask data created using optical proximity correction and a resolution enhancement technology with reference to a design layout created at a designing party. An existing-type library stores a design layout pattern proven to be free from manufacturing defects. The mask data verification apparatus compares the design layout with a design layout pattern stored in the existing-type library and extracts a design layout pattern found to be neither equal nor similar as a new-type design layout pattern. The mask data verification apparatus creates mask data for a new-type design layout pattern stored in the new-type library using OPC/RET and performs post-verification.

The mask data verification apparatus extracts a design layout pattern found to be neither equal nor similar as a new-type design layout pattern, creates mask data for the new-type design layout pattern using OPC/RET, and performs post-verification. The mask data verification apparatus can previously verify a new design layout pattern, shorten a semiconductor device manufacturing period, ensure efficient development, and improve a manufacturing yield.

DETAILED DESCRIPTION

Figure 1:
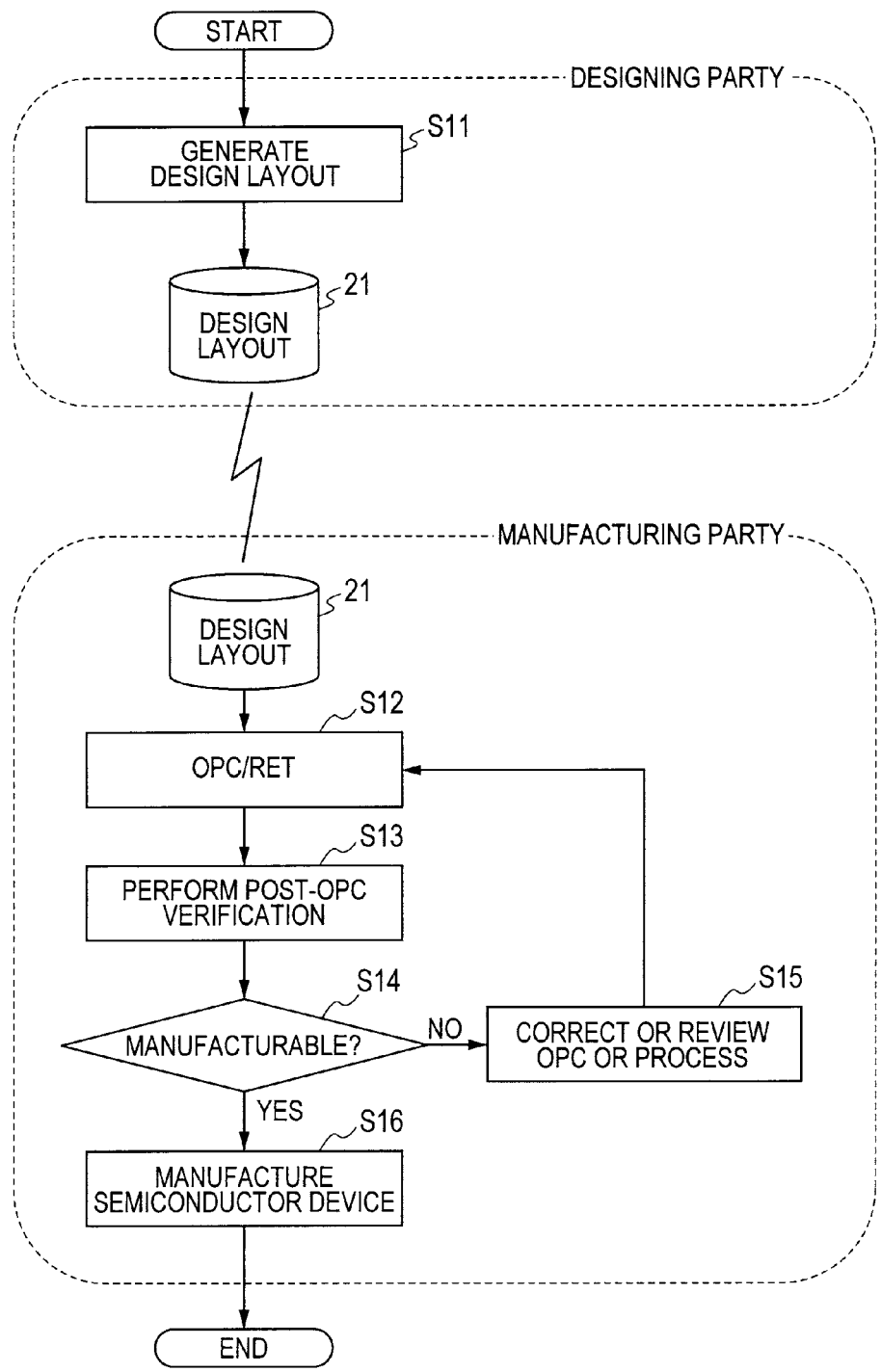
FIG. 1 exemplifies a general semiconductor device manufacturing flow.

FIG. 1 exemplifies a general semiconductor device manufacturing flow. In FIG. 1, a designing party is equivalent to a design department in a fabless company or a vertically integrated semiconductor manufacturer. A manufacturing party is equivalent to a manufacturing department in a mask manufacturer or a vertically integrated semiconductor manufacturer. However, the designing party and the manufacturing party are not limited thereto.

The designing party creates a design layout 21 (S11). Actually, the designing party variously verifies created design layouts. However, this step is omitted from the example. The created design layout 21 is supplied to the manufacturing party.

The manufacturing party receives the design layout 21 and performs OPC/RET (Resolution Enhancement Technology) (S12) and then performs post-OPC verification (S13). If a post-OPC verification result indicates that the design layout is manufacturable (YES at step S14), the flow proceeds to manufacture of the semiconductor device (S16).

If the post-OPC verification result indicates that the design layout is not manufacturable (NO at step S14), the flow requires correcting OPC/RET specifications and the tool or reviewing process conditions (S15). The flow repeats steps S12 through S15 until the design layout is determined to be manufacturable.

The post-OPC verification includes verification (Mask Rule Check: MRC) of photomask manufacturing issues and verification (lithography verification) of lithography process issues using the photomask. The flow may detect issues regarding manufacturing, circuit operations, and electric characteristics based on estimation of a finished wafer shape. The design layout pattern may be reviewed if it is determined to be unmanufacturable. The example in FIG. 1 omits this step.

In the manufacturing flow in FIG. 1, the OPC/RET process (S12) and the post-OPC verification process (S13) are the most time-consuming. The OPC or process improvement and confirmation (S15) requires the heaviest development load. As described above, development of these steps at the semiconductor device manufacturing stage affects the manufacturing schedule.

Obviously, the manufacturing party includes not only the above-mentioned steps but also photomask manufacturing and other steps that use design layouts as input and are needed for semiconductor device manufacturing. The OPC/RET includes correction patterns, supplementary patterns (Sub-Resolution Assist Feature: SRAF) finer than resolution limits, phase shifter placement, division or distribution to multiple exposures and masks, division or distribution to multiple masks for DPT (Double Patterning Technology). The OPC/RET and the post-OPC verification include the mask pattern correction and verification for mask manufacturing.

The embodiment of the invention concerns the technique of extracting design layout patterns that do not match or approximate to a design layout pattern presupposed in the manufacturing party. The designing party supplies the manufacturing party with a new-type design layout pattern, that is, a design layout pattern not presupposed at the manufacturing party, at a stage earlier than the manufacturing period. The technique thereby aims at ensuring a period for improving OPC specifications, enhancing the manufacturing yield, and shortening a manufacturing period.

The manufacturing flow according to the embodiment of the invention previously extracts a new-type design layout pattern not presupposed at the manufacturing party. The flow thereby aims at shortening a development period needed for OPC/RET and process condition improvement and advancing a time point to start the development.

The OPC/RET development period is supplemented below. The designing party applies various verifications to a completed design layout and then supplies the design layout to the manufacturing party. Normally, several days of retaining period are required for this purpose. The time to start development can be advanced several days and a sufficient development period can be ensured if a new-type design layout pattern is supplied to the manufacturing party prior to various verifications.

The design layout is finalized after several stages. Another several weeks of development period can be ensured if new-type design layout patterns are previously extracted from a design layout prior to the finalized version and are supplied to the manufacturing party. In this case, all new-type layouts might not be extracted. A certain percentage of new-types can be extracted in advance. This is effective for ensuring a development period.

The manufacturing party normally spends one day or longer from acquisition of the design layout to the OPC initiation or to completion of the post-OPC verification. In addition, the design layout might remain goods in process depending on loads on a factory or OPC computers. The manufacturing party can ensure a development period equivalent to the retaining period if the manufacturing party extracts a new-type design layout pattern at the time of its acquisition.

The present invention is effectively applicable to the manufacture of semiconductor devices using 40-nm nodes or finer. This type of manufacture is generally under control of RDR (Reduced Design Rule or Restricted Design Rule) that strictly restricts shapes or intervals of design layout patterns. This is because the technique works more effectively as a set of manufacturable design layout patterns decreases. The semiconductor device manufacture using 40-nm nodes or finer requires RDR in order to ensure easy manufacturing against the trend of fine processing technologies and prevent a design margin from decreasing due to increasing manufacturing variations.

Figure 2:
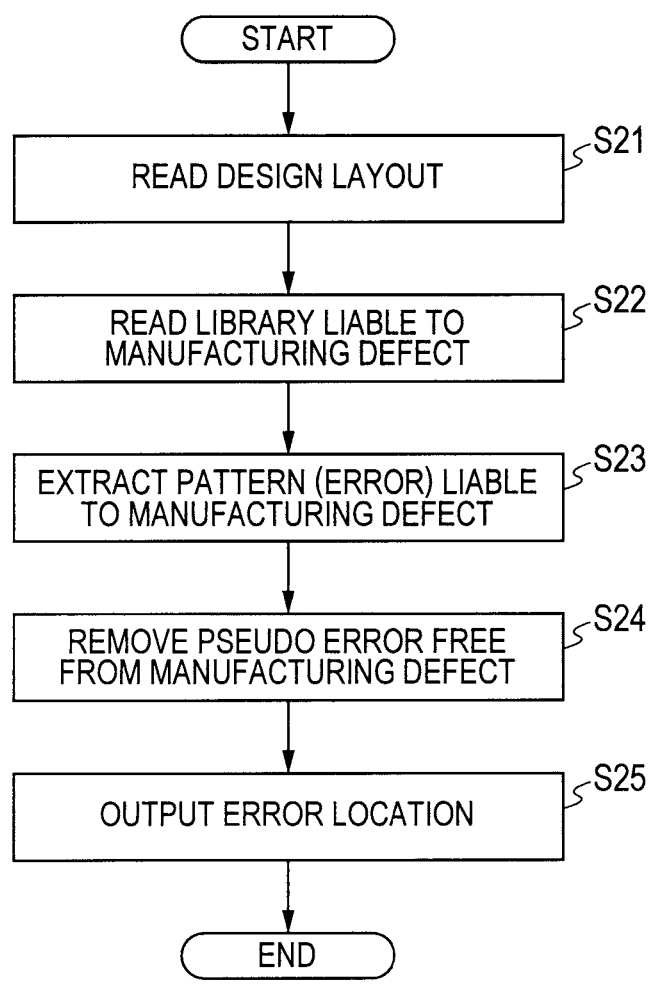
FIG. 2 is a flowchart showing a general design layout verification method.

FIG. 2 is a flowchart showing a general design layout verification method. The method reads a design layout (S21). The method then reads a set of design layout patterns liable to manufacturing defects (S22). The set is read as a library. The method extracts a pattern (error) liable to a manufacturing defect (S23). The method detects a design layout pattern not liable to a manufacturing defect as a pseudo error. The method removes the pseudo error (S24) and then outputs an error location (S25).

Step 22 involves the most difficult technicalities of thoroughly defining design layout patterns liable to manufacturing defects including unknown patterns.

Figure 3:
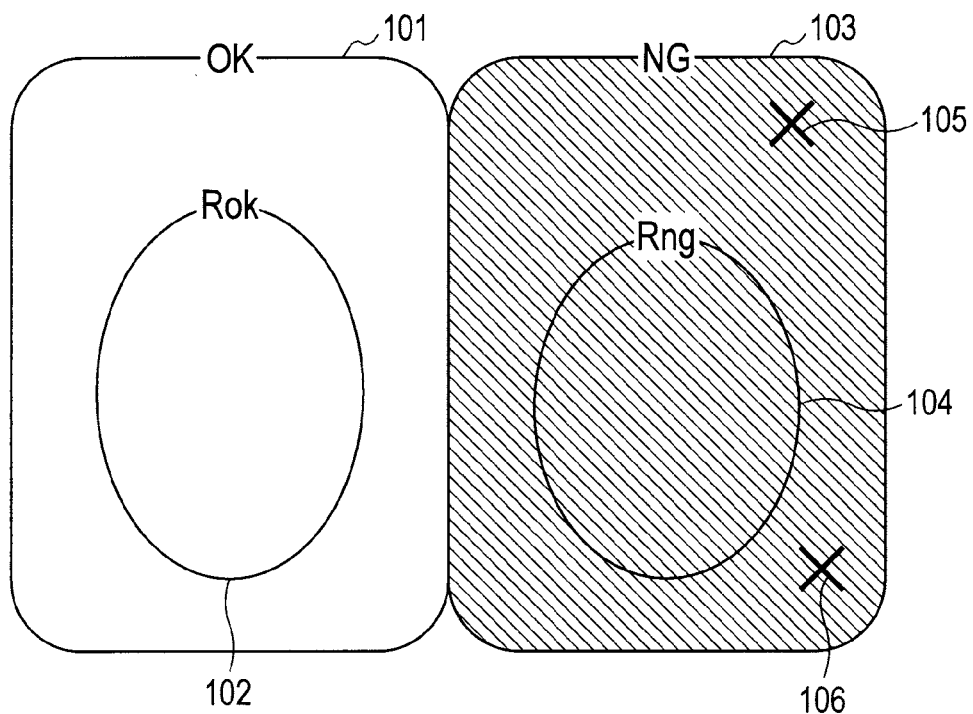
FIG. 3 shows an ideal form of design layout pattern set extracted as a verification error during design layout verification.

FIG. 3 shows an ideal form of design layout pattern set extracted as a verification error during design layout verification. The set contains a set 101 of manufacturable design layout patterns and a set 103 of design layout patterns liable to manufacturing defects.

The set 102 contains design layout patterns proven to be free from manufacturing defects according to past manufacturing results. The set 104 contains design layout patterns proven to be liable to manufacturing defects.

Design layout patterns 105 and 106 have no past manufacturing result and are uncertain about being liable to manufacturing defects. The unknown design layout patterns 105 and 106 are contained in the set 103. This signifies that only design layout patterns liable to manufacturing defects are thoroughly detected as verification errors.

Figure 4:
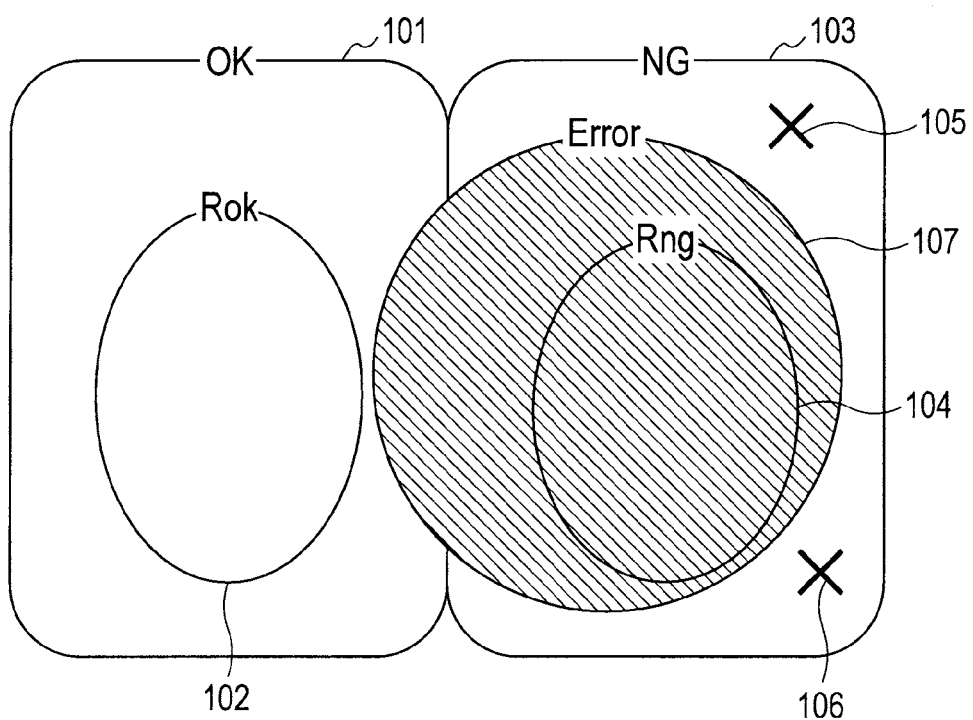
FIG. 4 shows a set of design layout patterns in which the general design layout verification method shown in FIG. 2 detects an error.

FIG. 4 shows a set of design layout patterns in which the general design layout verification method shown in FIG. 2 detects an error. Compared to FIG. 3, a set 107 of design layout patterns with errors to be detected includes part of the set 101 and does not include part of the set 103. The set 107 is defined so as to include the design layout pattern set 104 proven to be liable to manufacturing defects and all (actually part of) unknown sets. Normally, the set 107 forms part of the set 101. The set 107 does not include the unknown design layout patterns 105 and 106 as its elements. This signifies that unknown ones of design layout patterns liable to manufacturing defects are not detected.

Figure 5:
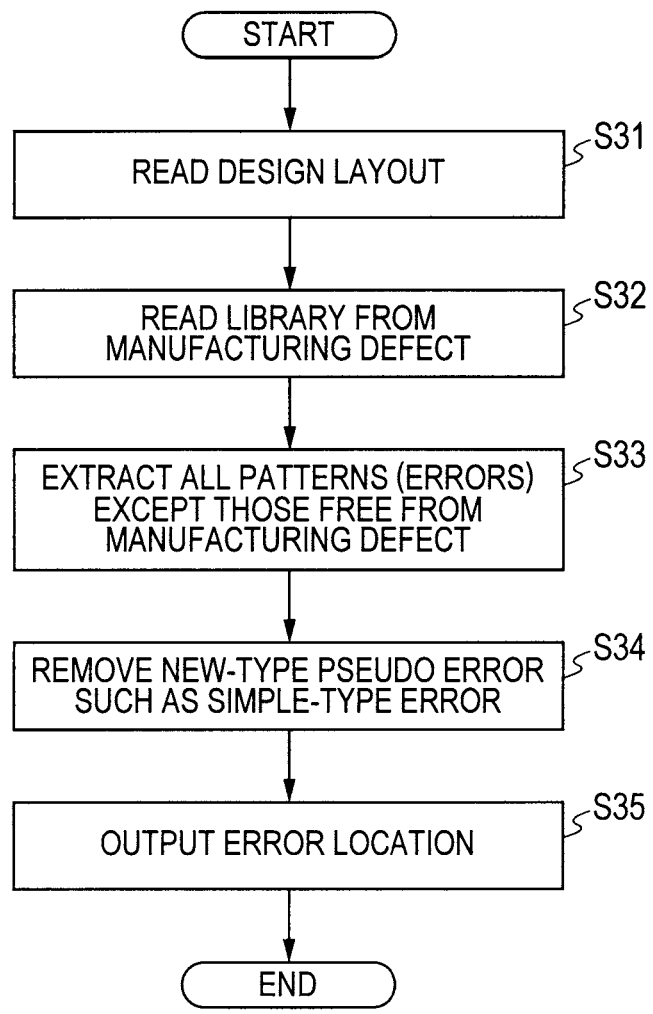
FIG. 5 is a flowchart outlining the design layout verification method according to an embodiment of the invention.

FIG. 5 is a flowchart outlining the design layout verification method according to the embodiment of the invention. The method reads a design layout (S31). The method then reads a set of design layout patterns free from manufacturing defects (S32). The set is read as a library.

The method extracts all patterns (errors) except those free from manufacturing defects (S33). The method removes a new-type pseudo error such as a simple-type error (S34) and then outputs an error location (S35).

This process eliminates the most difficult technicalities of thoroughly defining design layout patterns liable to manufacturing defects including unknown patterns as described with reference to FIG. 2 showing the general design layout verification method. That is, the embodiment of the invention defines a set of design layout patterns showing past manufacturing results and a set of design layout patterns obviously free from manufacturing defects.

Figure 6:
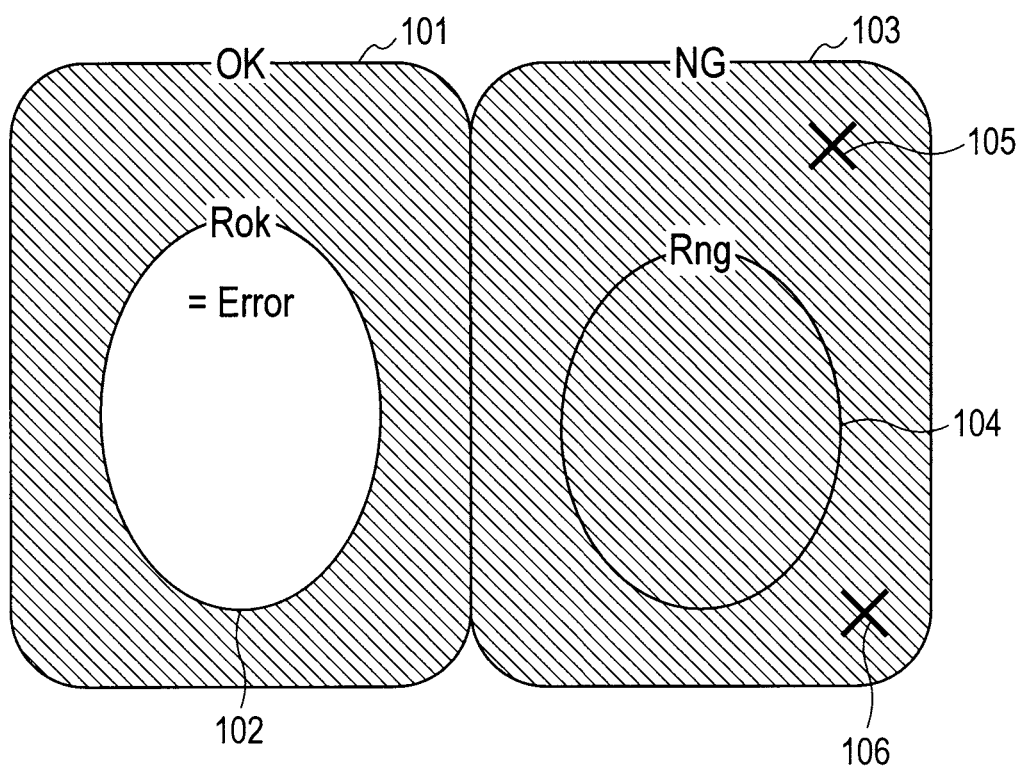
FIG. 6 shows a set of design layout patterns in which the design layout verification method shown in FIG. 5 according to the embodiment of the invention detects an error.

FIG. 6 shows a set of design layout patterns in which the design layout verification method shown in FIG. 5 according to the embodiment of the invention detects an error. Compared to FIG. 4, sets (shaded) of design layout patterns with errors to be detected are defined as a complement set of the set 102 proven to be free from manufacturing defects based on past manufacturing results. This definition is easy because the set 102 is known.

The sets (shaded) of design layout patterns with errors to be detected include the whole of the set 103, the set 104, and the unknown design layout patterns 105 and 106. This signifies that the sets of design layout patterns liable to manufacturing defects can be thoroughly detected.

The sets (shaded) of design layout patterns with errors to be detected include the complement set of the set 102 in the set 101. A design layout pattern originally free from a manufacturing defect might be detected as an error. Concerning this portion, a method to be described can exclude a set of design layout patterns obviously free from manufacturing defects from the portion, detect only actual new-type design layouts, and reduce the portion. Even in this case, the unknown design layout patterns 105 and 106 remain verification errors.

As described above, the embodiment of the invention can detect all design layout patterns liable to manufacturing defects without thoroughly defining such patterns including unknown ones. Embodiments of the present invention will be described in further detail.

First Embodiment

In the first embodiment of the invention, an apparatus used for the designing party is referred to as a design layout verification apparatus. An apparatus used for the manufacturing party is referred to as a mask data verification apparatus.

Figure 7:
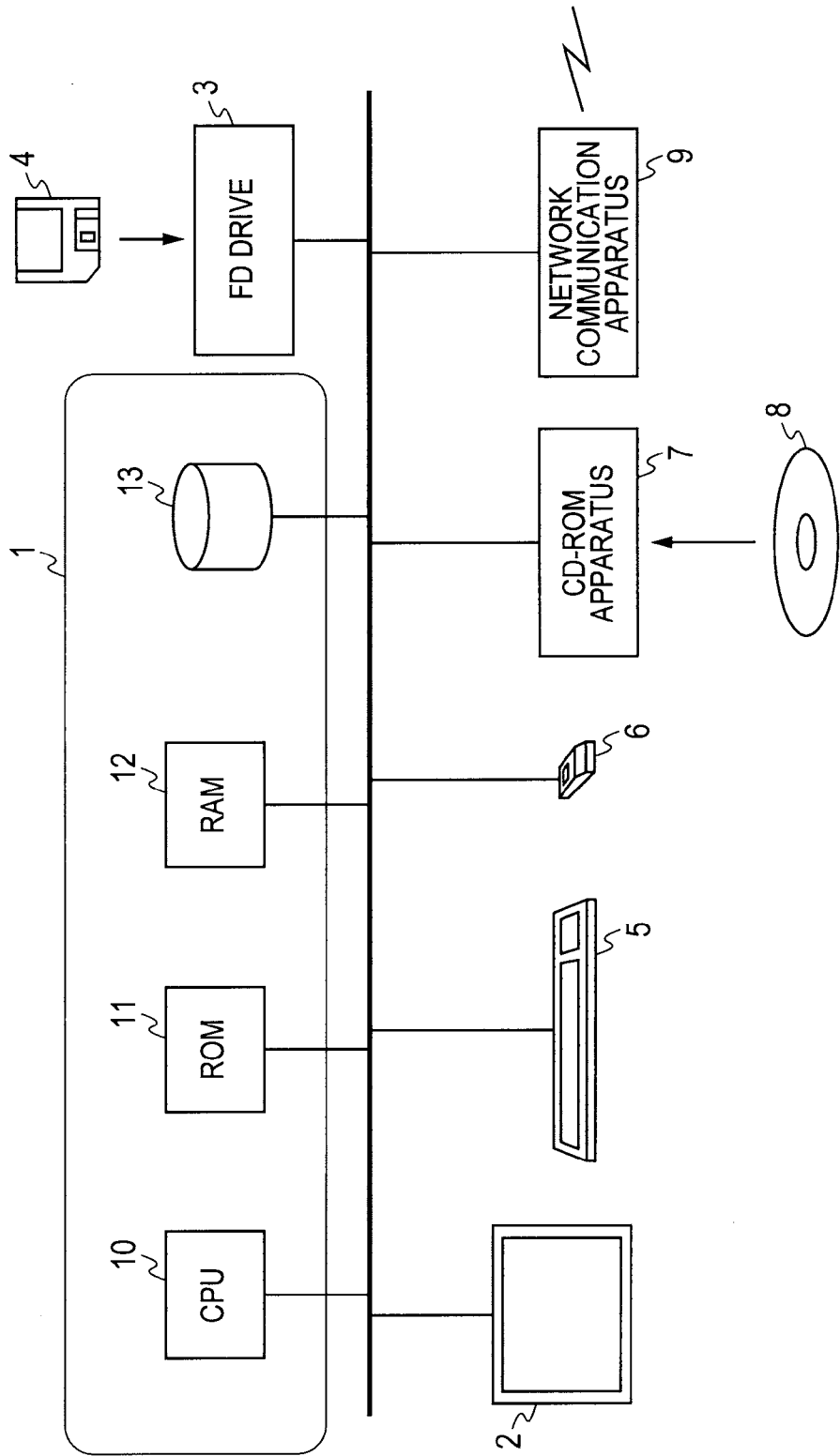
FIG. 7 is a block diagram showing an example configuration of a design layout verification apparatus according to a first embodiment of the invention.

FIG. 7 is a block diagram showing an example configuration of a design layout verification apparatus according to the first embodiment of the invention. The following describes only the configuration of the design layout verification apparatus because it is the same as that of the mask data verification apparatus.

The design layout verification apparatus is available as an ordinary computer and includes a computer body 1, a display apparatus 2, an FD drive 3 mounting an FD (Flexible Disk) 4, a keyboard 5, a mouse 6, a CD-ROM apparatus 7 mounting CD-ROM (Compact Disc-Read Only Memory) 8, and a network communication apparatus 9. A design layout verification program is supplied as a recording medium such as the FD 4 or the CD-ROM 8. The design layout verification program runs on the computer body 1 to verify design layouts. The design layout verification program may be supplied to the computer body 1 from the other computers through a communication line.

The computer body 1 includes a CPU 10, ROM (Read Only Memory) 11, RAM (Random Access Memory) 12, and a hard disk 13. The CPU 10 performs processes while exchanging data with the display apparatus 2, the FD drive 3, the keyboard 5, the mouse 6, the CD-ROM apparatus 7, the network communication apparatus 9, the ROM 11, the RAM 12, or the hard disk 13. The CPU 10 allows the FD drive 3 or the CD-ROM apparatus 7 to store the design layout verification program recorded on the FD 4 or the CD-ROM 8 in the hard disk 13. The CPU 10 loads the design layout verification program into the RAM 12 from the hard disk 13 as needed and executes the program to verify design layouts.

Figure 8:
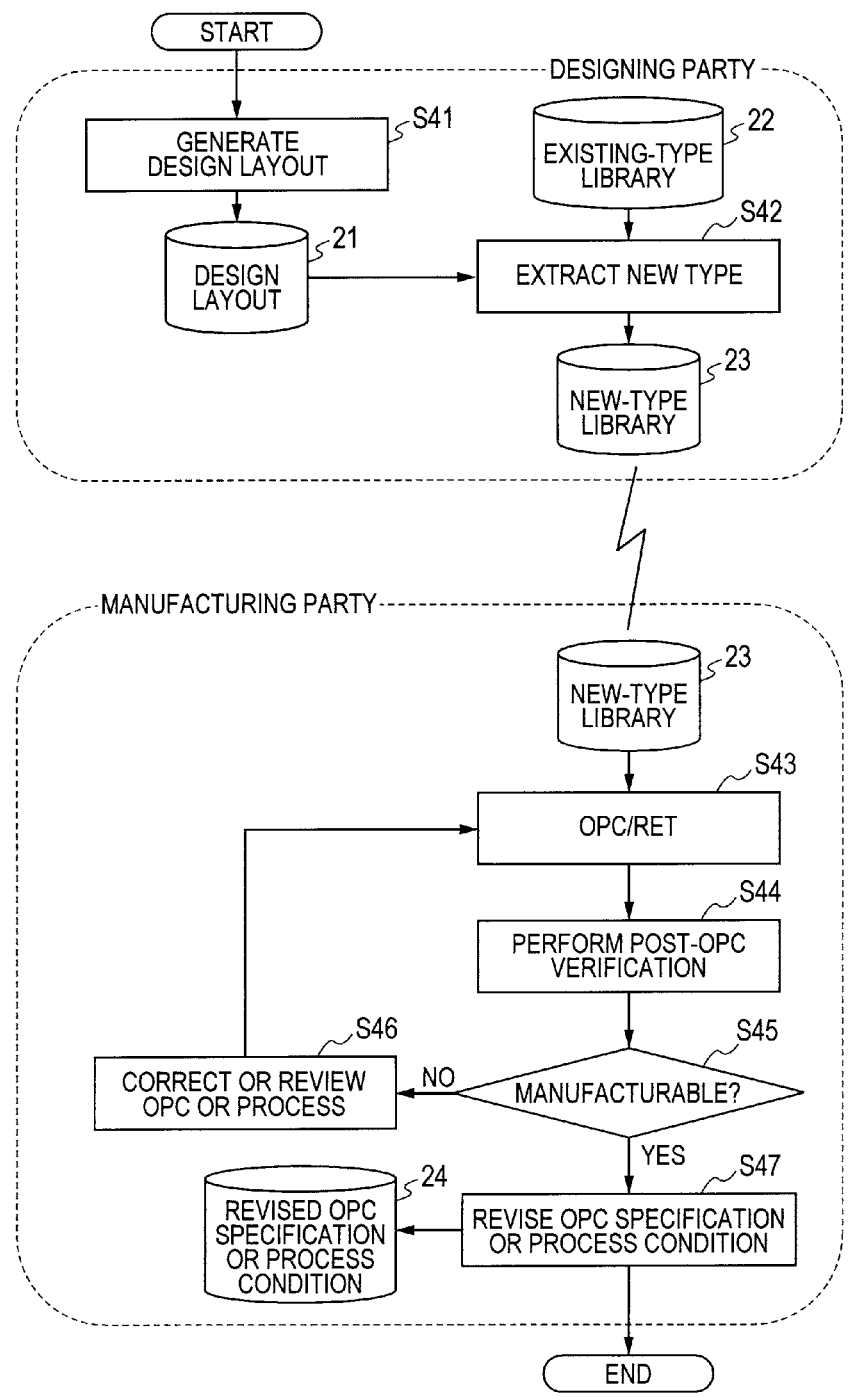
FIG. 8 shows a flow of new type extraction, preliminary OPC/RET, and preliminary process development using a design layout verification apparatus and a mask data verification apparatus according to the first embodiment of the invention.
Figure 9:
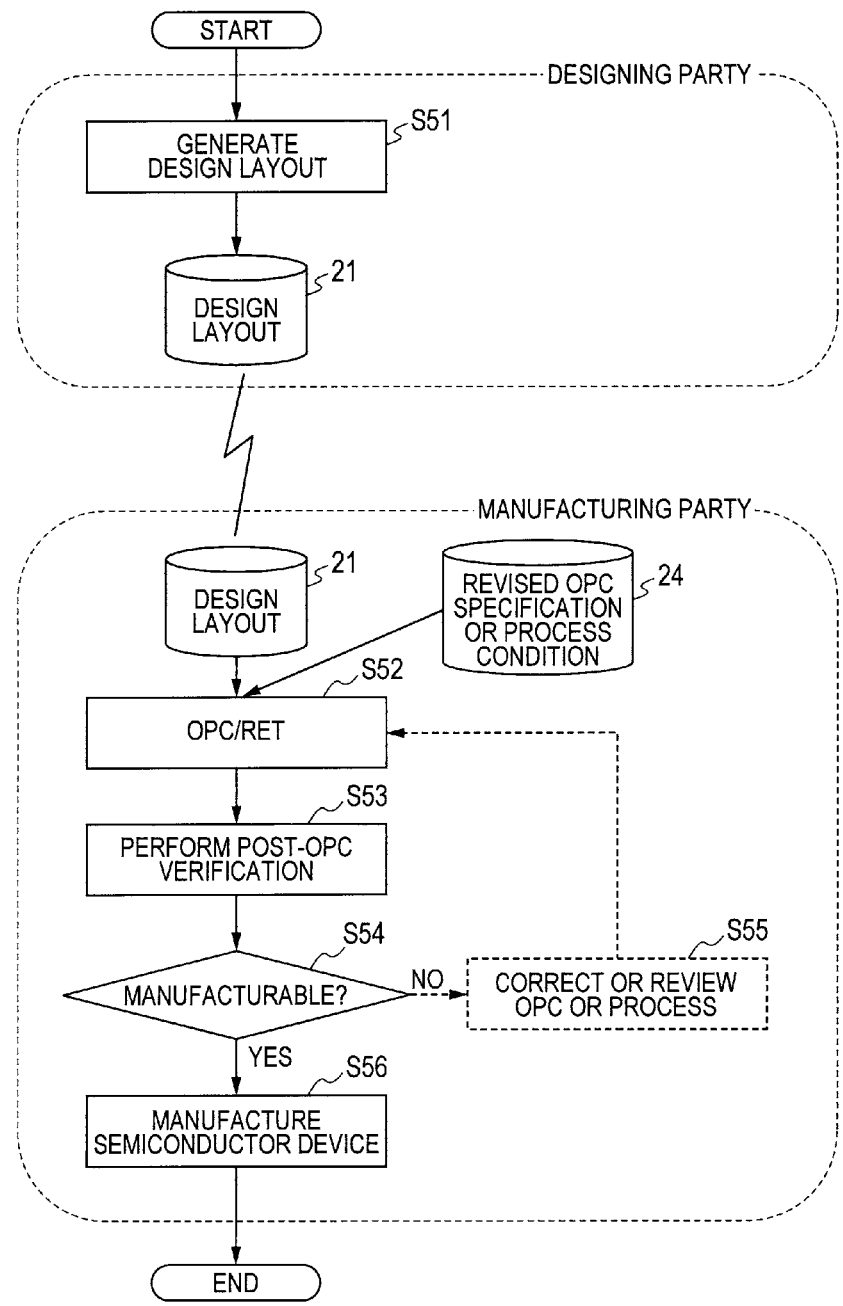
FIG. 9 shows a manufacturing flow using the design layout verification apparatus and the mask data verification apparatus according to the first embodiment of the invention.

FIGS. 8 and 9 are flowcharts showing processes of the design layout verification apparatus and the mask data verification apparatus according to the first embodiment of the invention. FIG. 8 shows the flow of new type extraction, preliminary OPC/RET, and preliminary process development. FIG. 9 shows the manufacturing flow.

An existing-type library 22 stores types of design layout patterns that deliver past manufacturing results and cause no yield problem. Any storage method is available as long as it can identify a design layout pattern. For example, specific design layout patterns may be stored. Design layout patterns may be provided with an allowable range of matches for the determination purpose. There may be provided a combination of entities parametrically maintaining design layout patterns and parameter values. Cell names may be provided.

The design layout verification apparatus generates the design layout 21 (S41). The design layout verification apparatus uses the design layout 21 and the existing-type library 22 as inputs and extracts a set of design layout patterns not included in the existing-type library 22, that is, neither equal to nor similar to the same, from the design layout 21. The design layout verification apparatus outputs the set as a new-type library 23 (S42).

There may be methods of storing a design layout pattern in the new-type library 23. Similarly to the existing-type library 22, any storage method is available as long as it can identify a design layout pattern.

The mask data verification apparatus performs OPC/RET using the new-type library 23 generated by the design layout verification apparatus (S43) and then performs post-OPC verification (S44). A post-OPC verification result may determine that the design layout patterns are manufacturable (YES at step S45). In this case, the mask data verification apparatus generates a revised OPC specification or process condition 24 (S47).

A post-OPC verification result may determine the design layout patterns are unmanufacturable (NO at step S45). In this case, the mask data verification apparatus corrects OPC/RET specifications and the tool or reviews process conditions (S46). Steps S43 through S46 are repeated until the design layout patterns are determined to be manufacturable.

The number of design layout patterns specified from the new-type library 23 is one several ten thousandth of the number of design layout patterns included in the design layout 21 used for manufacturing. The development period shortens.

The new-type library 23 can be supplied to the manufacturing party earlier than the design layout 21. The development can start before completion of the OPC/RET process and the post-OPC verification for semiconductor device manufacturing. Accordingly, the OPC/RET development is completed early.

With reference to the flowchart in FIG. 9, the following describes the manufacturing flow according to the first embodiment of the invention. The design layout verification apparatus generates the design layout 21 (S51).

The mask data verification apparatus performs OPC/RET on the received design layout 21 (S52) and then performs post-OPC verification (S53). A post-OPC verification result may determine the design layout is manufacturable (YES at step S54). In this case, the mask data verification apparatus proceeds to manufacture of the semiconductor device (S56).

The flow in FIG. 9 is void of the development repetition as shown in FIG. 1 (drawn with dotted line in FIG. 9). The reason follows. The manufacturing flow according to the embodiment uses the OPC specification or process condition 24 as input for manufacturing at the OPC/RET (step S52) and subsequent steps. The OPC specification or process condition 24 is previously revised according to a sequence of development steps (S43 to S47 in FIG. 8) using the new-type library 23. The design layout 21 therefore does not include unexpected new-type design layout patterns.

While OPC/RET has been chiefly described, a new design layout pattern might be provided due to changes in the standard cell library, EDA tools such as P&R, and its settings and is more likely to cause problems during a design or manufacturing stage. The embodiment is also applicable to the correction in consideration of lithography, the yield control, and the failure analysis.

The semiconductor device inspection can be focused on a path that includes change points in a new layout pattern. This enables to shorten the inspection time and efficiently guarantee the semiconductor device.

According to the first embodiment of the invention as described above, the design layout verification apparatus extracts a new-type design layout using the design layout 21 and the existing-type library 22. The mask data verification apparatus verifies a new-type design layout not presupposed at the manufacturing party. The embodiment can shorten a semiconductor device manufacturing period and improve the manufacturing yield due to efficient development.

The designing party supplies the manufacturing party with a new-type library at an early stage of production development or at the time of changing the design scheme or P&R tools. The manufacturing party can strengthen measures aimed at change points, improve the yield early, and hasten the shipment time.

Second Embodiment

According to the first embodiment of the invention, as shown in FIG. 8, the designing party maintains the existing-type library 22 for extracting the new-type library 23. The designing party needs to generate the existing-type library 22 based on past results supplied to the manufacturing party. Alternatively, the manufacturing party needs to supply the existing-type library 22 to the designing party. The designing party also needs to extract new-type design layouts. The designing party requires workloads. The manufacturing party needs to provide information to the designing party.

According to the second embodiment of the invention, the manufacturing party generates the existing-type library 22 based on past manufacturing results and extracts new-type design layouts.

Figure 10:
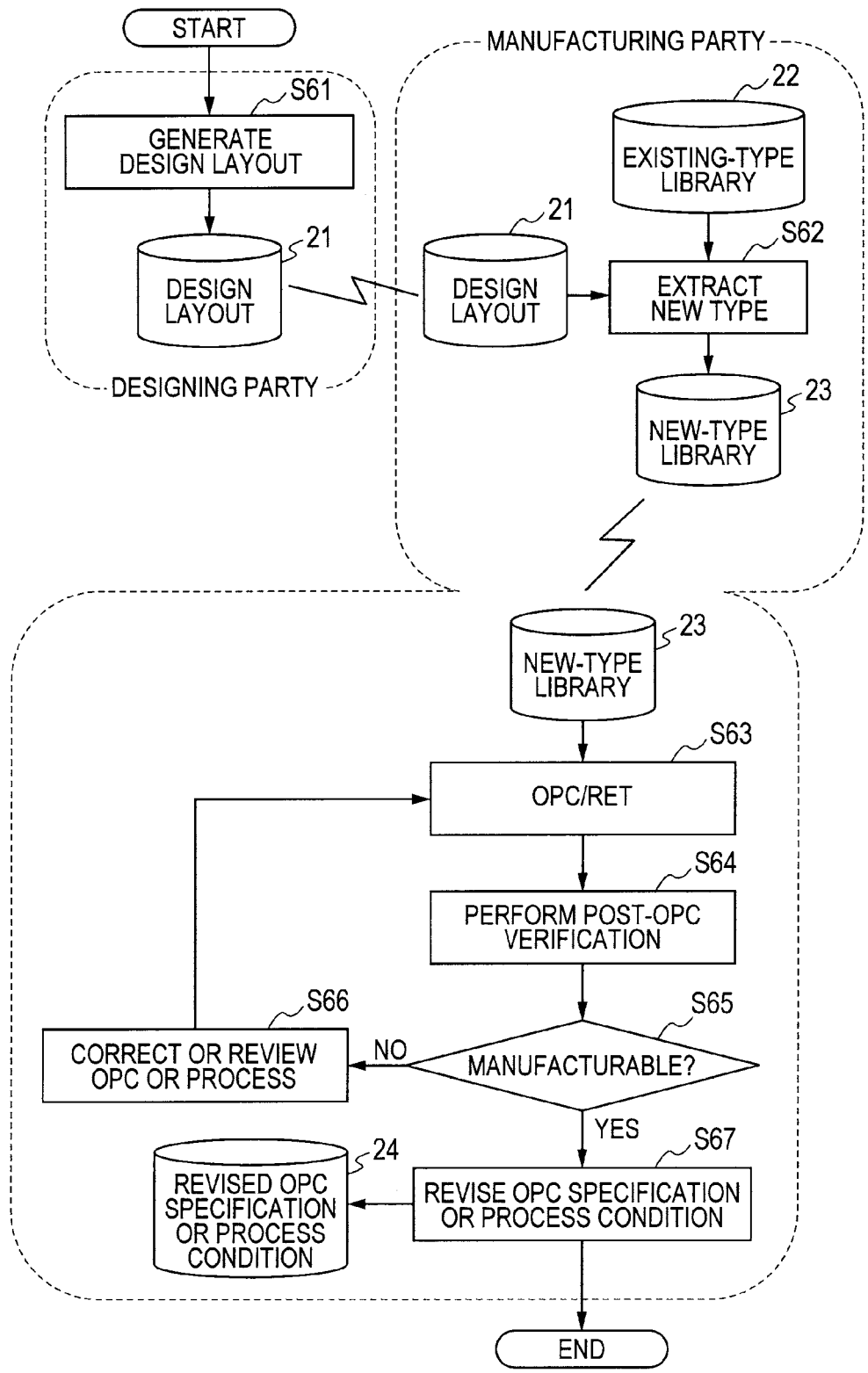
FIG. 10 is a flowchart showing processes of a design layout verification apparatus and a mask data verification apparatus according to a second embodiment of the invention.

FIG. 10 is a flowchart showing processes of a design layout verification apparatus and a mask data verification apparatus according to the second embodiment of the invention. A manufacturing flow according to the second embodiment is equal to that of the first embodiment shown in FIG. 9. A detailed description is therefore omitted.

The design layout verification apparatus provided for the designing party generates the design layout 21 (S61).

The mask data verification apparatus uses the design layout 21 supplied from the designing party and the existing-type library 22 as inputs and extracts a set of design layout patterns not included in the existing-type library 22, that is, neither equal to nor similar to the same, from the design layout 21. The mask data verification apparatus outputs the set as the new-type library 23 (S62).

The mask data verification apparatus performs OPC/RET using the generated new-type library 23 (S63) and then performs post-OPC verification (S64). A post-OPC verification result may determine the design layout patterns are manufacturable (YES at step S65). In this case, the mask data verification apparatus generates the OPC specification or process condition 24 revised as needed (S67).

A post-OPC verification result may determine the design layout patterns are unmanufacturable (NO at step S65). In this case, the mask data verification apparatus corrects OPC/RET specifications and the tool or reviews process conditions (S66). Steps S63 through S66 are repeated until the design layout patterns are determined to be manufacturable.

The designing party need not manage the existing-type library 22 or extract new-type design layouts. The manufacturing party need not supply the existing-type library 22 to the designing party. On the other hand, the designing party acquires the new-type library 23 after the manufacturing party acquires the design layout 21. The time of initiation of prior development delays. It may be preferable to choose from the flows in FIGS. 8 and 10 in consideration of the advantage and the disadvantage.

According to the second embodiment of the invention as described above, the mask data verification apparatus at the manufacturing party extracts a new-type design layout using the design layout 21 and the existing-type library 22. The designing party need not manage the existing-type library or extract a new-type design layout in addition to the effect described in the first embodiment. The designing party can reduce workloads. The manufacturing party is capable of closed development and manufacturing.

Third Embodiment

The first and second embodiments of the invention do not change the existing-type library 22 in the middle of processes. Depending on circumstances, the manufacturing party might categorize a design layout pattern into the new type and the designing party might re-extract that design layout pattern and supply it to the manufacturing party.

According to the third embodiment of the invention, the manufacturing party categorizes a design layout pattern as the new type and delivers it to the designing party. The designing party adds the new-type design layout pattern to update the existing-type library 22.

Figure 11:
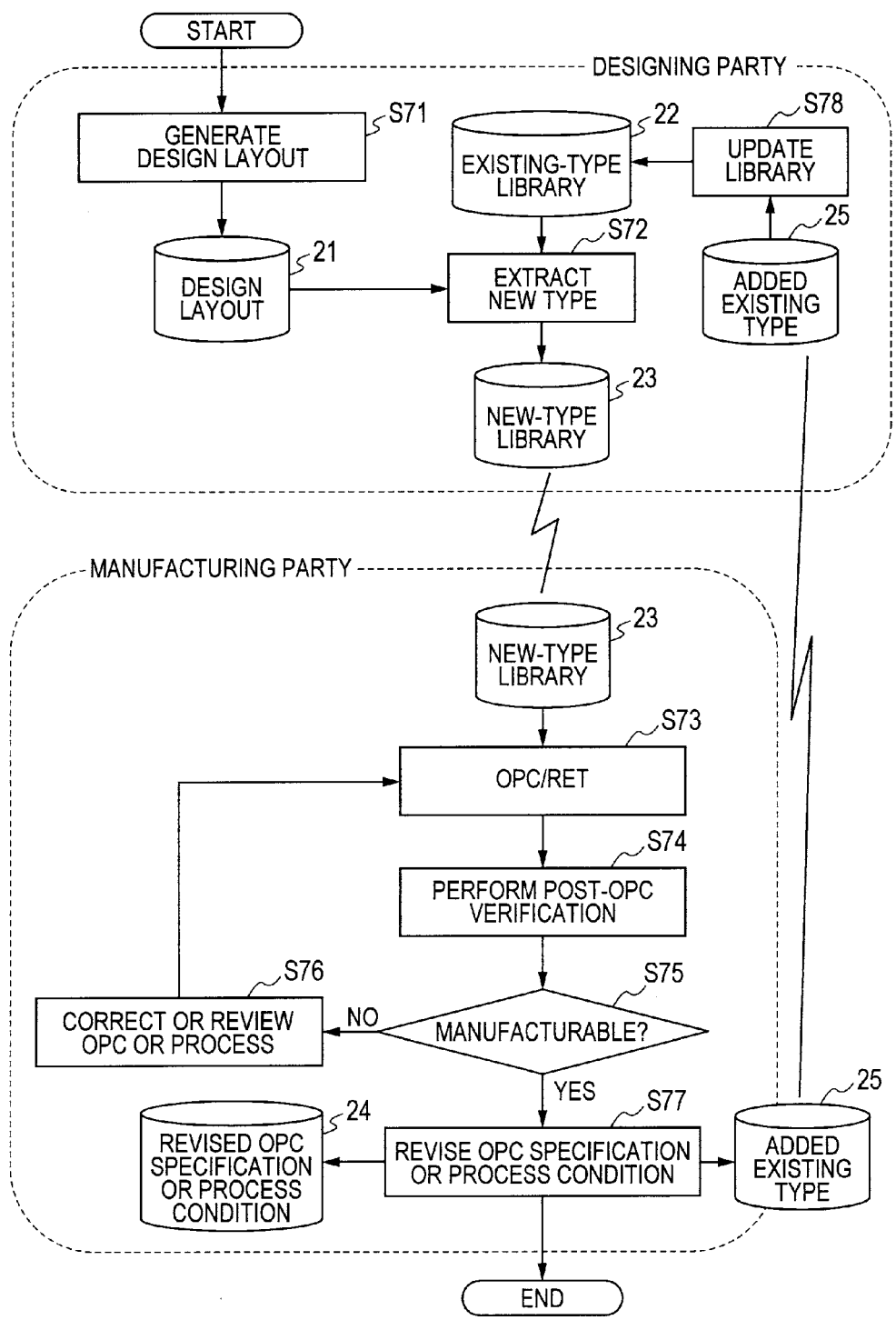
FIG. 11 is a flowchart showing processes of a design layout verification apparatus and a mask data verification apparatus according to a third embodiment of the invention.

FIG. 11 is a flowchart showing processes of a design layout verification apparatus and a mask data verification apparatus according to the third embodiment of the invention. A manufacturing flow according to the third embodiment is equal to that of the first embodiment shown in FIG. 9. A detailed description is therefore omitted.

The design layout verification apparatus generates the design layout 21 (S71). The design layout verification apparatus uses the design layout 21 and the existing-type library 22 as inputs and extracts a set of design layout patterns not included in the existing-type library 22, that is, neither equal to nor similar to the same, from the design layout 21. The design layout verification apparatus outputs the set as a new-type library 23 (S72).

The mask data verification apparatus performs OPC/RET using the new-type library 23 generated by the design layout verification apparatus (S73) and then performs post-OPC verification (S74). A post-OPC verification result may determine the design layout patterns are manufacturable (YES at step S75). In this case, the mask data verification apparatus generates the OPC specification or process condition 24 revised as needed and generates an added existing type 25 (S77). The added existing type 25 is delivered to the designing party.

The added existing type signifies a newly found design layout pattern that is dealt with and is cleared of problem at the manufacturing party or caused no problem even if no action was taken.

A post-OPC verification result may determine the design layout patterns are unmanufacturable (NO at step S75). In this case, the mask data verification apparatus corrects OPC/RET specifications and the tool or reviews process conditions (S76). Steps S73 through S76 are repeated until the design layout patterns are determined to be manufacturable.

The design layout verification apparatus adds the added existing type 25 delivered from the manufacturing party to the existing-type library 22 and thereby updates the library (S78). The updated existing-type library 22 is subsequently used when the design layout verification apparatus extracts a new-type design layout. The added existing type 25 just needs to store a design layout pattern itself or information about it.

Figure 12:
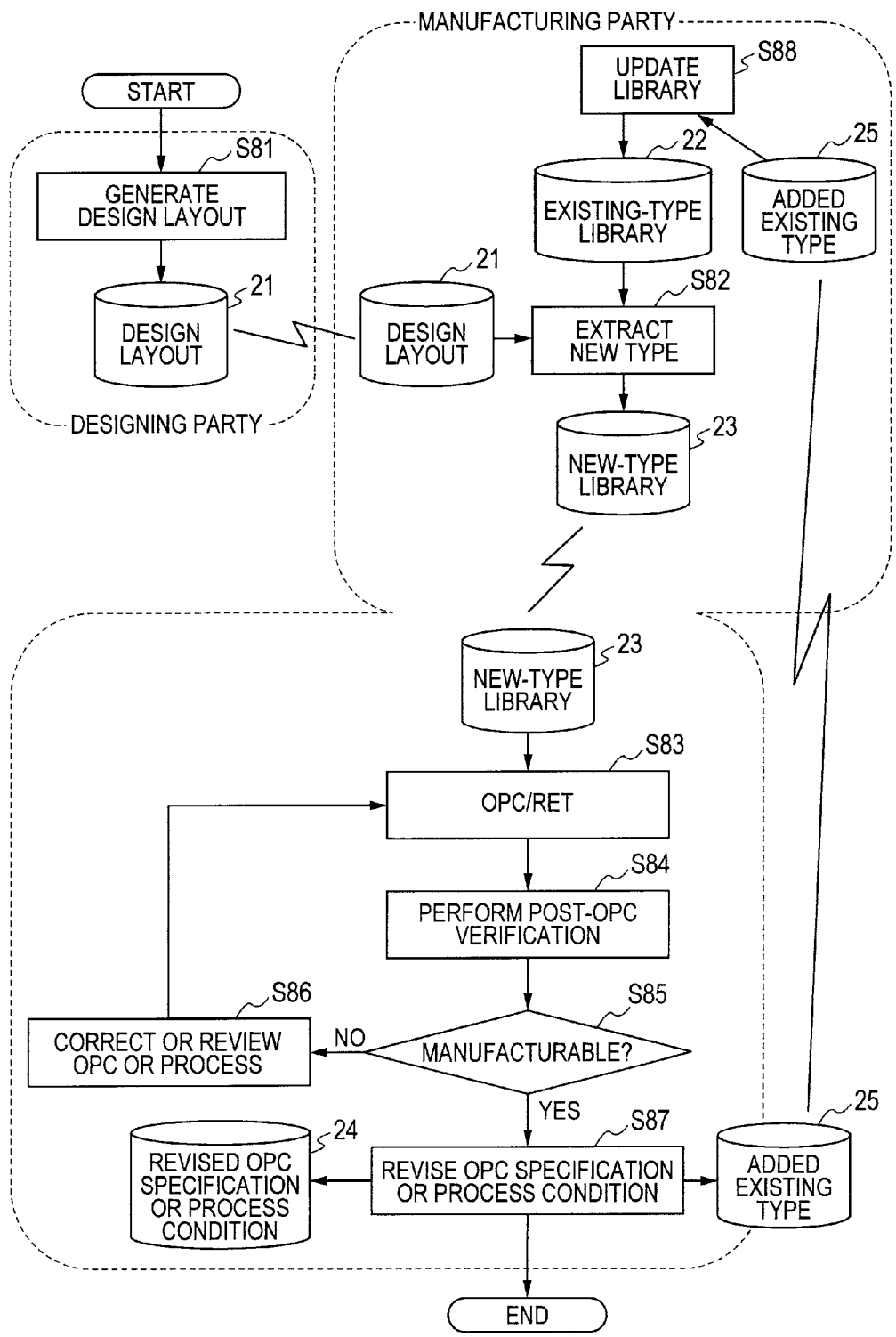
FIG. 12 is a flowchart showing a modification of processes of a design layout verification apparatus and a mask data verification apparatus according to the third embodiment of the invention.

FIG. 12 is a flowchart showing a modification of processes of a design layout verification apparatus and a mask data verification apparatus according to the third embodiment of the invention. The design layout verification apparatus provided for the designing party generates the design layout 21 (S81).

The mask data verification apparatus uses the design layout 21 supplied from the designing party and the existing-type library 22 as inputs and extracts a set of design layout patterns not included in the existing-type library 22, that is, neither equal to nor similar to the same, from the design layout 21. The mask data verification apparatus outputs the set as the new-type library 23 (S82).

The mask data verification apparatus performs OPC/RET using the generated new-type library 23 (S83) and then performs post-OPC verification (S84). A post-OPC verification result may determine the design layout patterns are manufacturable (YES at step S85). In this case, the mask data verification apparatus generates the OPC specification or process condition 24 revised as needed and the added existing type 25 (S87).

A post-OPC verification result may determine the design layout patterns are unmanufacturable (NO at step S85). In this case, the mask data verification apparatus corrects OPC/RET specifications and the tool or reviews process conditions (S86). Steps S83 through S86 are repeated until the design layout patterns are determined to be manufacturable.

The mask data verification apparatus adds the added existing type 25 to the existing-type library 22 and thereby updates the library (S88). The updated existing-type library 22 is subsequently used when the mask data verification apparatus extracts a new-type design layout.

Design rules for the designing party are revised based on the added existing type 25. The designing party can use design layout patterns whose use is guaranteed. The designing party can increase the design possibility and employ a manufacturing flow such as reducing the chip size.

As described above, there may be a design layout pattern that is already dealt with or need not be dealt with at the manufacturing party. The third embodiment of the invention adds such design layout pattern to the existing-type library and updates it. In addition to the effects described in the first and second embodiments, the third embodiment prevents a design layout pattern already dealt with from being detected again as the new-type and enables the manufacturing to efficiently proceed.

Fourth Embodiment

The fourth embodiment of the invention describes in more detail extraction and library update of the existing-type library 22, the new-type library 23, the added existing type 25, and the new type described in the first through third embodiments.

FIGS. 13A through 13D exemplify design layout patterns stored in the existing-type library 22. In FIGS. 13A through 13D, shaded regions 201 through 207 represent electric conductors in the semiconductor device. Each of FIGS. 13A through 13D represents one design layout pattern.

Figure 13A:
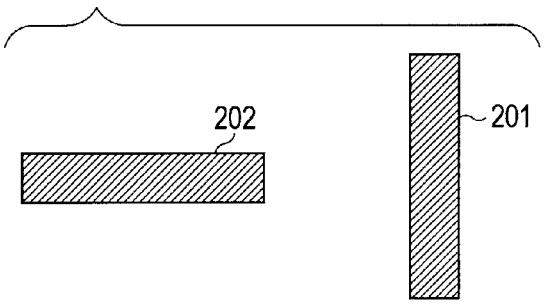
FIGS. 13A through 13D exemplify design layout patterns stored in an existing-type library 22.
Figure 13B:
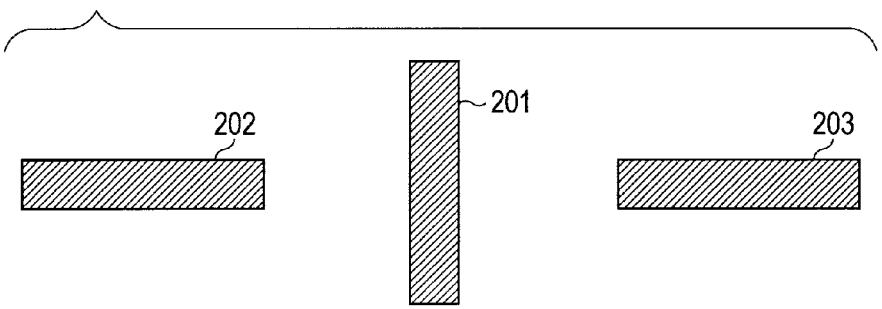

FIG. 13A shows a design layout pattern in which only a region 202 is located to the left of a region 201. FIG. 13B shows a design layout pattern in which the region 202 and a region 203 are respectively located to the left and the right of the region 201.

Figure 13C:
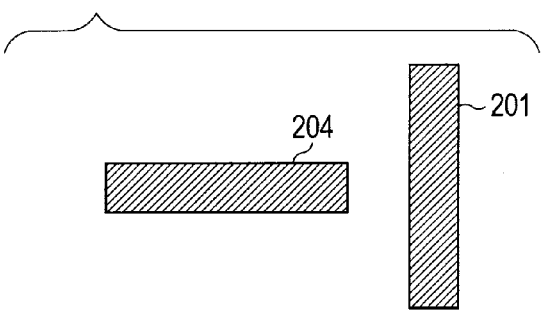
Figure 13D:
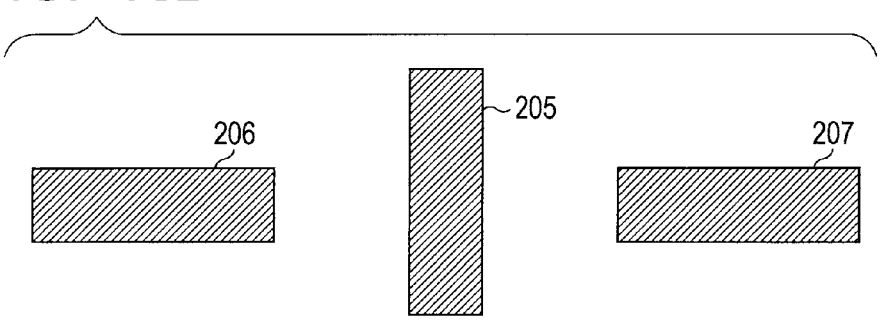

FIG. 13C shows a design layout pattern in which only a region 204 is located to the left of the region 201 and is nearer to the region 201 than the region 202 shown in FIG. 13A. FIG. 13D shows a design layout pattern in which a region 206 and a region 207 are respectively located to the left and the right of a region 205 and the regions 205 through 207 are thicker than the regions 201 through 203 shown in FIG. 13B.

Figure 14A:
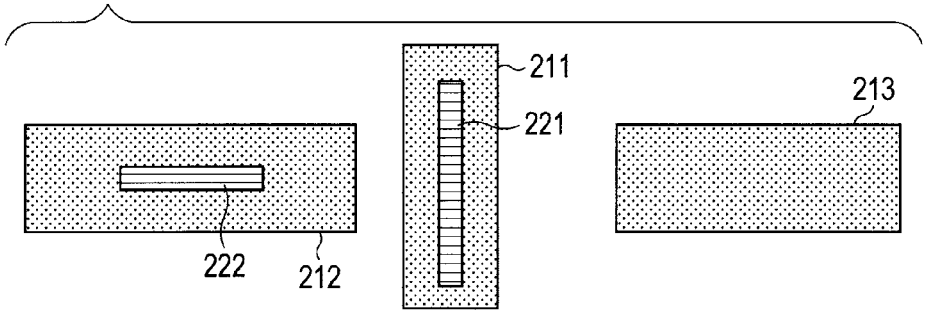
FIGS. 14A through 14D exemplify the existing-type library 22 containing design layout patterns by storing abstract conditions.

FIGS. 14A through 14D exemplify the existing-type library 22 containing design layout patterns by storing abstract conditions. As shown in FIG. 14A, design layout patterns stored in the existing-type library 22 include the following regions. Regions 221 and 222 must contain patterns. Regions 211 through 213 must be free from surrounding patterns.

Figure 14B:
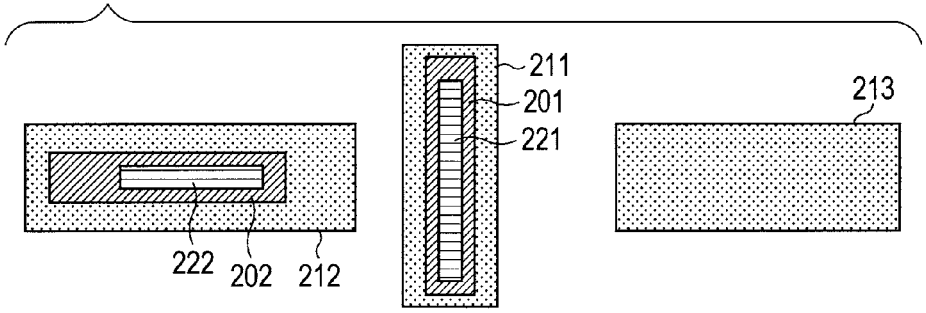

FIG. 14B shows that the design layout patterns stored in the existing-type library 22 as shown in FIG. 14A are overlapped with the design layout pattern shown in FIG. 13A. The design layout pattern shown in FIG. 13A is included in the set of the existing-type library shown in FIG. 14A. The reason follows. The regions 201 and 202 included in the design layout pattern shown in FIG. 13A completely include the regions 221 and 222 that must include the patterns shown in FIG. 14A. The regions 201 and 202 are completely included in the regions 211 through 213 that must be free from surrounding patterns.

Figure 14C:
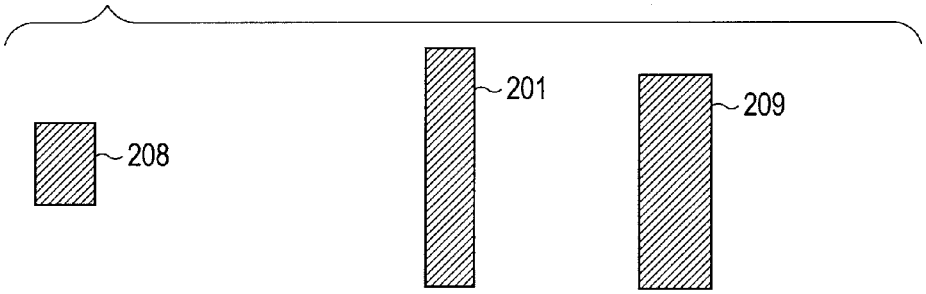

FIG. 14C exemplifies a design layout pattern not included in the existing-type library shown in FIG. 14A. Regions 208 and 209 shown in FIG. 14C are similar to the equivalent regions shown in FIGS. 13A through 13D and represent electric conductors in the semiconductor device.

Figure 14D:
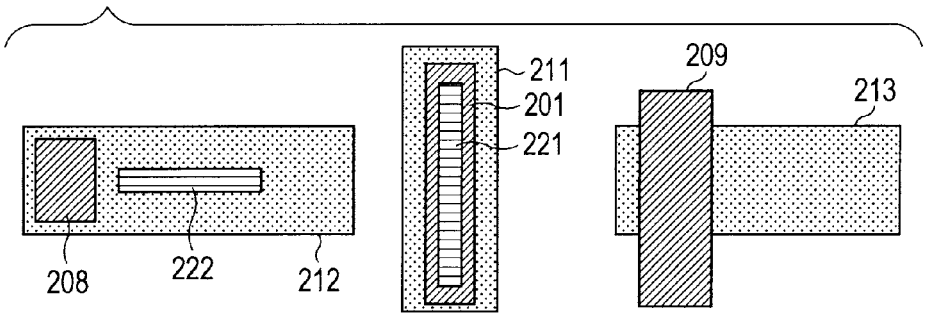

FIG. 14D shows that the design layout patterns stored in the existing-type library 22 as shown in FIG. 14A are overlapped with the design layout pattern shown in FIG. 14C. The design layout pattern shown in FIG. 14C is not included in the set of the existing-type library shown in FIG. 14A. The reason follows. The region 222 is covered with none of the regions 201, 208, and 209. The region 209 is located outside the region 213.

The following describes a method of storing multiple design layout patterns as one set in the existing-type library. As shown in FIGS. 14A through 14D, the regions 221 and 222 must contain patterns and the regions 211 through 213 must be free from surrounding patterns. These regions are generated from a set of design layout patterns as follows.

ANDing the set of design layout patterns may generate the regions 221 and 222. The regions 211 through 213 may be generated by ORing the same.

If a few differences are ignored, undersizing causes AND and oversizing causes OR, making it possible to easily generate the existing-type library.

The above-mentioned example shows the design layout patterns of the same type of electric conductors. The design layout patterns may be insulators. The same applies to design layout patterns including multiple mask layers or different types of materials and devices such as an active region and an electric conductor.

Figure 15A:
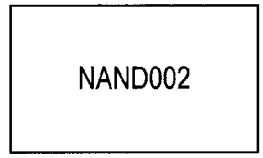
FIGS. 15A through 15C exemplify design layout patterns that reference structures.
Figure 15B:
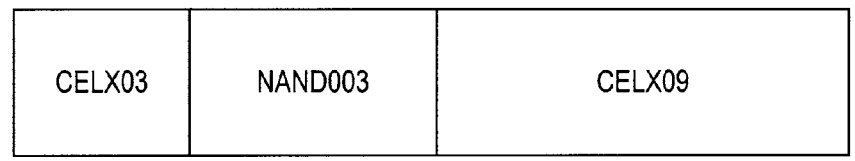
Figure 15C:
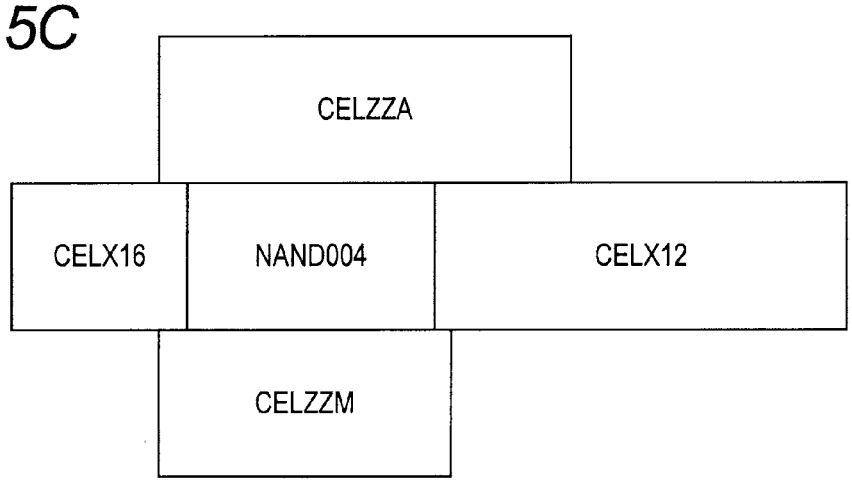

The existing-type library 22 can store a name indicating the set of design layout patterns. The following describes examples of storing structure names in the GDSII Calma stream format, a typical format of storing design layouts. FIGS. 15A through 15C exemplify design layout patterns that reference structures.

NAND002:
NAND003: L/CELX03 R/CELX09
NAND004: L/CELX16 R/CELX12 U/CELZZA D/CELZZM

The first row corresponds to FIG. 15A and indicates a design layout pattern in which structure NAND002 is referenced.

The second row corresponds to FIG. 15B and indicates a design layout pattern in which structure NAND003 at the first column is referenced, CELX03 beginning with "L/" is adjacently referenced to the left of NAND003, and CELX09 beginning with "R/" is adjacently referenced to the right thereof.

Similarly, the second row corresponds to FIG. 15C and indicates a design layout pattern in which structure NAND004 is referenced, CELX16 is referenced to the left of NAND004, CELX12 is referenced to the right thereof, CELZZA is referenced at the top thereof, and CELZZM is referenced at the bottom thereof.

The existing-type library 22 can use coordinates to store a region that includes design layout patterns within a given design layout. Examples follow.

448761 984095 449122 984422
271589 2657427 271910 2657740

The first row represents a rectangular region whose diagonal line is formed between coordinates (448761, 984095) and coordinates (449122, 984422). The same applies to the second row.

In the following description, a design layout object signifies an element configuring design layout patterns contained in a design layout. In the above-mentioned description, the electric conductor 201 or the structure name is equivalent to the design layout object.

Figure 16:
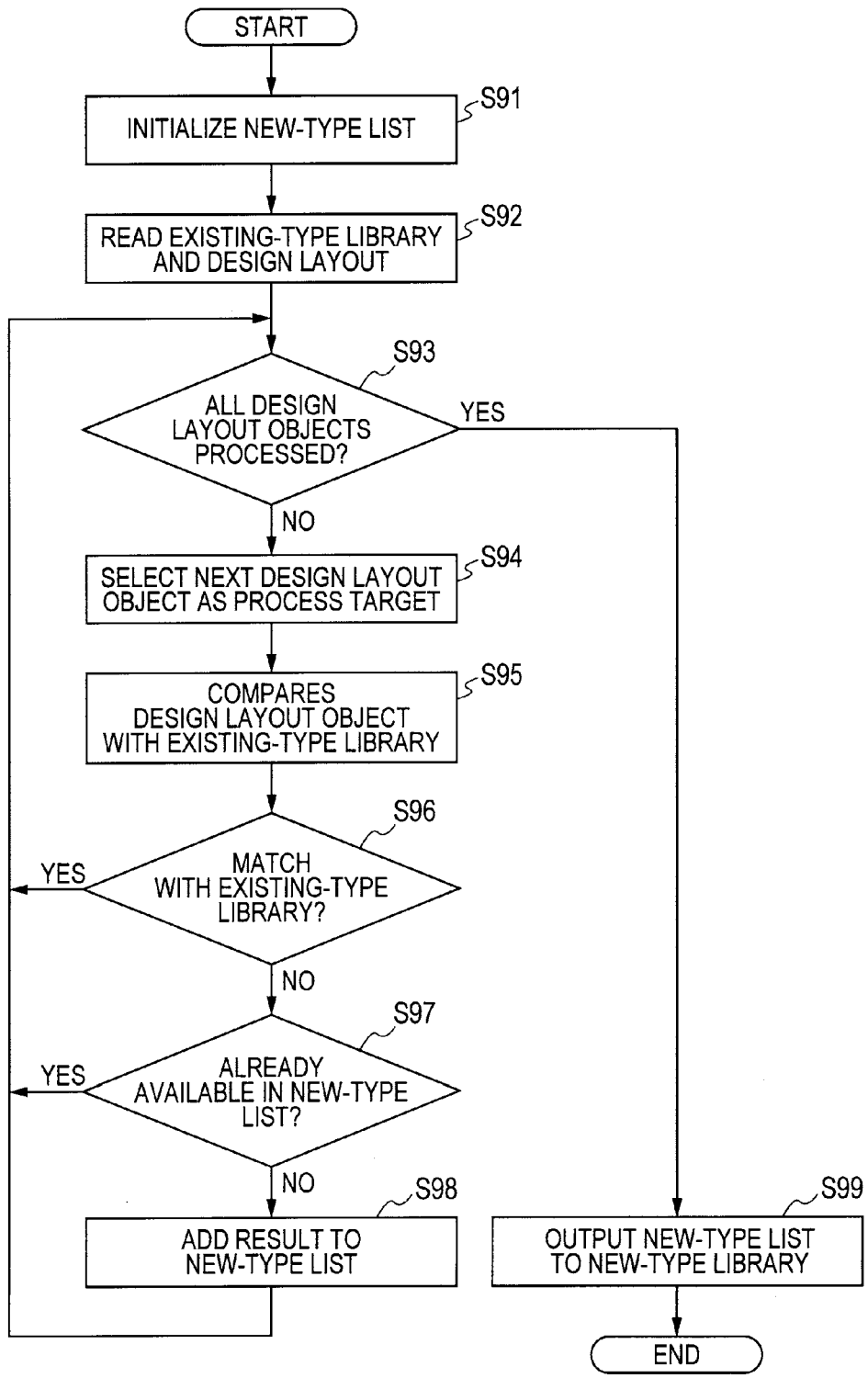
FIG. 16 is a flowchart showing a new type extraction process.

FIG. 16 is a flowchart showing a new type extraction process. The design layout verification apparatus or the mask data verification apparatus initializes a new-type list (S91). During processes, the new-type list temporarily stores a design layout object that is determined to be a new type and is finally output to the new-type library.

The apparatus reads the existing-type library 22 and the design layout 21 (S92). The apparatus determines whether all design layout objects in the design layout 21 have been processed (S93).

If all the design layout objects have not been processed (NO at step S93), the apparatus selects a design layout object as a process target (S94). Standard formats for storing design layouts include the GDSII Calma stream format and the OASIS format. Design layout objects can be selected in the order of the stored data or in the order of the data after it is expanded to a higher hierarchy. As already known in the related art, design layout objects can be selected by searching for positions in the chip.

The apparatus compares the design layout object selected at step S94 as a process target with the existing-type library 22 (S95). If the design layout object matches the existing-type library 22 (YES at step S96), the apparatus returns to step S93 and repeats the subsequent process.

If the design layout object does not match the existing-type library 22 (NO at step S96), the apparatus determines whether the design layout object is already contained in the new-type list (S97).

If the design layout object is already contained in the new-type list (YES at step S97), the apparatus returns to step S93 and repeats the subsequent process. If the design layout object is not contained in the new-type list (NO at step S97), the apparatus adds the design layout object selected as a process target to the new-type list, returns to step S93, and repeats the subsequent process. If all the design layout objects have been processed (YES at step S93), the apparatus outputs the new-type list to the new-type library 23 (S99) and terminates the process.

The following describes an example of comparing a design layout object with the existing-type library shown at step S95 in FIG. 16. The example uses process layout objects as the design layout patterns, that is, the elements shown in FIGS. 13A through 13D and 14A through 14D.

One polygon is selected as a design layout object if the design layout patterns as shown in FIGS. 13A through 13D configure the existing-type library. A characteristic location (such as the corner) of the layout object is allowed to overlap with the existing-type library in order to check for a match between the selected polygon as well as surrounding polygons and the existing-type library. Exclusive OR (XOR) as a logical operation for graphics is then performed to easily detect whether a difference exists.

A preliminary step may compare the numbers of vertexes or areas to determine obviously different design layout objects. This also enables to reduce processing loads and shorten the process time.

If process layout objects are equivalent to the elements shown in FIGS. 14A through 14D, a characteristic location such as a corner or an active transistor is overlapped with the existing-type library and a logical operation for graphics is similarly performed to easily determine a match. In the example of FIG. 14A, the regions for the design layout patterns 201 and 202 are removed (NOT operation) from the regions 221 and 222 that must contain design layout patterns. A mismatch is determined if there remains a fragment of the region that must contain a design layout pattern.

No design layout pattern must exist outside the regions 211 through 213. These regions are removed from the regions for the design layout patterns 201 and 202. A mismatch is determined if there remains a fragment of the design layout pattern.

The following describes a case where a process layout object includes information that can indicate the design layout. The match determination process will be easier if the existing-type library includes a structure name and its reference (arrangement) position. If the existing-type library includes only structure names, for example, references of structures in the design layout are specified one by one as targets for the determination. For match determination, the reference is compared with a structure name stored in the existing-type library.

If the existing-type library includes the positioning relation between a structure name and an adjacent structure, references of structures in the design layout are also specified one by one as targets for the determination. The match determination is performed by comparing the structure name and the name of an approximate or adjacent structure with the contents of the existing-type library.

A chip coordinate space may represent regions in a specific design layout if a process layout object includes information that can indicate the design layout. A specified region is selected from the specific design layout. Any of the above-mentioned methods can be then used for the match determination.

The new-type library 23 stores the same information format as that stored in the existing-type library 22. The format just needs to be able to specify a targeted design layout pattern. Accordingly, a detailed description is omitted.

The added existing type 25 stores the same information format as that stored in the existing-type library 22. The format just needs to be able to specify a targeted design layout pattern. Accordingly, a detailed description is omitted.

Finally, the library update adds information that contains similar elements. The process method is obvious and a description is omitted.

As described above, the fourth embodiment of the invention compares design layout objects having the above-mentioned formats with the existing-type library, extracts a new type, and updates the library. In addition to the effects described in the first through third embodiments, the fourth embodiment enables more efficient processes on a computer.

Fifth Embodiment

Generally, the OPC/RET process needs to be performed in consideration of the proximity effect during manufacturing processes. It is known that design layout patterns cannot be handled as the same if they approximate to each other at a specific distance and differ from each other. A region within the specific distance is hereinafter referred to as a frame region. The distance is normally equivalent to hundreds of nanometers.

The first through fourth embodiments do not take into consideration the frame region for determination between match and mismatch. Accordingly, the manufacturing party cannot accurately perform OPC/RET. The fifth embodiment of the invention takes into consideration the frame region for matching comparison and generates the new-type library including the frame region. The manufacturing party is capable of development with higher precision.

Figure 17A:
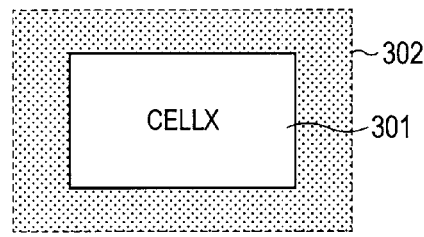
FIGS. 17A through 17D illustrate the necessity of considering a frame region.
Figure 17B:
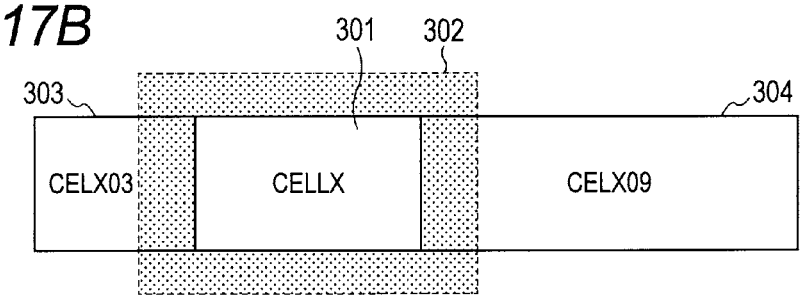
Figure 17C:
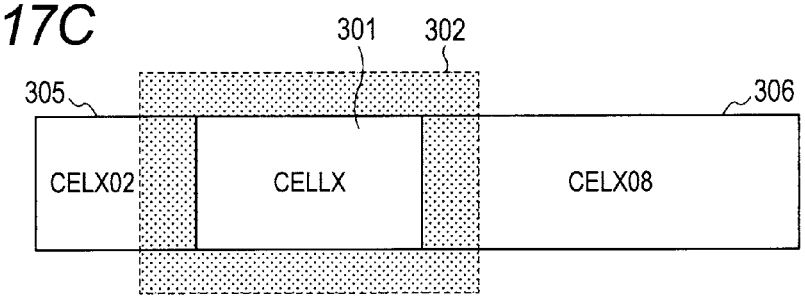
Figure 17D:
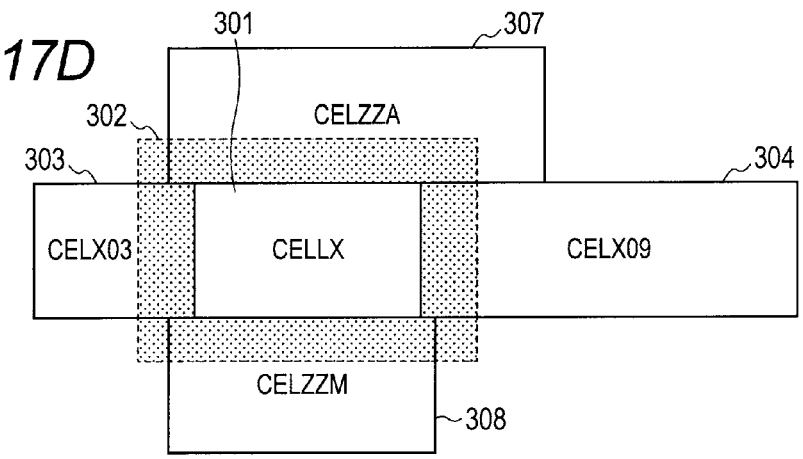

FIGS. 17A through 17D illustrate the necessity of considering the frame region. FIG. 17A exemplifies a design layout including a structure 301 named CELLX. A region 302 is the frame region that approximates to the structure 301 and surrounds it.

A result of applying OPC/RET to design layout patterns in the structure 301 depends on design layout patterns contained in the region 302. If the region 302 is not considered, manufacturability of the structure 301 using OPC/RET differs from that of the structure 301 contained in the actual design layout.

For simplicity, let us consider that the existing-type library 22 contains only structures. FIGS. 17A through 17D exemplify the structure 301 and adjacent structures contained in the design layout.

The structures 301 through 308 are contained in the design layout. Generally, different situations as shown in FIGS. 17A through 17D also cause different results of examining the structure 301. It is difficult to assume the situations as shown in FIGS. 17A through 17D to be manufacturable existing types just because the structure 301 is contained in the existing-type library.

This example relates to the existing-type library 22 containing only structures. The same applies to the existing-type library that contains the sets of design layout patterns as shown in FIGS. 13A through 13D and 14A through 14D, the combinations of structures as shown in FIGS. 15A through 15C, or the above-mentioned design layout regions.

The fifth embodiment of the invention solves this problem by performing match comparison and generating a new-type library in consideration of the frame region. With reference to FIG. 16, the following describes a process according to the embodiment. The fifth embodiment differs from the fourth embodiment in that the design layout object, the new-type list, and the existing-type library contains frame regions.

The design layout verification apparatus or the mask data verification apparatus initializes the new-type list (S91). A design layout pattern stored in the new-type list includes a core region and the frame region. The core region evaluates OPC/RET and is equivalent to the structure 301 in FIG. 17A. The frame region needs to be taken into consideration in order to accurately evaluate the core region and is equivalent to region 302 in FIG. 17A.

The apparatus reads the existing-type library 22 and the design layout 21 (S92). The apparatus determines whether all design layout objects in the design layout 21 have been processed (S93).

All design layout objects in the design layout 21 may not have been processed (NO at step S93). In this case, the apparatus extracts a design layout object including the core region and the frame region specifies the design layout object as a target (S94).

The apparatus compares the design layout object specified as a target at step S94 with the existing-type library 22 including the core region and the frame region. As described above, the embodiment generates the existing-type library 22 including the frame region. Therefore, step S96 determines a mismatch if the frame regions differ even though the core regions match.

At step S97, the apparatus also compares the new-type list with the design layout object specified as a target including the frame region and performs determination. The design layout object may not be contained in the new-type list (NO at step S97). In this case, the design layout object including the core region and the frame region is added to the new-type list. The new-type list including the core region and the frame region is output to the new-type library 23.

A manufacturing flow also takes into consideration the frame region. The process will be briefly described with reference to FIG. 8. The process for OPC/RET at step S43 and subsequent steps uses the new-type library 23 because it contains the frame region. The post-OPC verification (S44) takes into consideration the frame region to perform simulation, verification, and measurement. The determination of manufacturability (S45) depends on manufacturability in the core region.

The same applies to processes shown in FIGS. 10 through 12. Therefore, a detailed description is omitted for simplicity.

As described above, the embodiment performs comparison for a match and generates a new-type list by taking into consideration the frame region. In addition to the effects described in the first through fourth embodiments, the fifth embodiment enables more accurate development at the manufacturing party.

Sixth Embodiment

The first through fifth embodiments output all design layout patterns not matching the existing-type library 22 to the new-type library 23. The new-type library 23 or the existing-type library 22 appended by the same contains a large number of design layout objects. Data handling is difficult. The processing time increases.

The sixth embodiment of the invention provides a method that removes unnecessary design layout patterns from the new-type library 23 and efficiently generates the new-type library 23 by limiting it to new types that should be originally taken into consideration.

There may be design layout patterns that are unavailable as new types to be taken into consideration. Such design layout patterns may be categorized into uninterested type, similar type, simple type, derived type, and manufacturable type. These types are described below.

The uninterested type concerns a set of design layout patterns that need not be registered to the existing-type library because of no or little need to evaluate the manufacturability. Generally, it is possible to easily manufacture design layout patterns that each have a specified width or more and are arranged at a specified interval or more.

A dummy pattern is provided for CMP (Chemical Mechanical Polishing), for example. Usually, it is unnecessary to evaluate manufacturability of such dummy patterns because high manufacturing accuracy is unneeded if an adjacent region does not contain a design layout pattern that might affect circuit operations. Dummy patterns can be easily extracted using graphics processing functions of commercially available EDA (Electronic Design Automation) tools such as DRC (Design Rule Check) and can be identified by a marker (marking).

A DRC tool supplies an object (e.g., triangle) as a marker to the position for a design layout pattern satisfying specified conditions and outputs the design layout pattern. It is easy to determine the subsequent processes depending on whether a design layout object is marked.

The semiconductor device might contain a specific region that is used for manufacturing tests and does not require manufacturing accuracy. Completely the same module such as a large-scale block for hardware macros might already deliver semiconductor device manufacturing results and require no evaluation. Such regions can also be marked.

The following describes a process for the uninterested type with reference to FIG. 16. The design layout verification apparatus or the mask data verification apparatus initializes the new-type list (S91). The apparatus reads the design layout 21 and a marker (S92).

The apparatus determines whether all design layout objects are processed depending on whether all marked or unmarked design layout patterns are processed in consideration of the presence or absence of a marker (S93). The apparatus specifies the next design layout object as a target in consideration of the presence or absence of a marker (S94).

The process at step S95 and subsequent steps is the same as that described above. The process can remove the uninterested type from the new-type library because the uninterested type need not evaluate the manufacturability.

The similar type concerns a set of design layout patterns similar to those contained in the existing-type library 22. With reference to FIGS. 14A through 14D, there has been described the method of storing similarly shaped design layout patterns as the same new type in the library. A detailed description is therefore omitted.

A match between design layout patterns signifies that the design layout patterns are shaped equally within an allowable range as well as completely equally.

The following describes the use of a library in consideration of the frame region as described in the fifth embodiment. In the description above, the fifth embodiment determines a match according to whether the core region and the frame region both match.

A difference between design layout patterns in the core region causes a remarkably larger effect on the OPC/RET result and the manufacturability evaluation than a difference between design layout patterns in the frame region. Different permissible amounts may be used for a difference in the core region and a difference in the frame region.

The fourth embodiment has described the method that registers a set of design layout patterns to the existing-type library 22. Undersizing and oversizing can easily change the allowable range. For this purpose, different undersizing and oversizing amounts can be applied to the core region and the frame region.

Due to manufacturing specialties, mirror symmetry or rotation of design layout objects may not change the manufacturability. In this case, related design layout patterns may be assumed to be the similar type.

From the viewpoint of manufacturing, design layout patterns may be assumed to be shaped similarly to those already contained in the existing-type library 22 and can be removed from the new-type library in accordance with the above-mentioned process flows.

The simple type concerns a set of design layout patterns that contain a small number of defining dimensions and have simple shapes. Examples of the simple type include a repetition of sufficiently long lines and spaces and independent hole patterns.

These shapes contain a small number of defining dimensions. The manufacturing party can comprehensively examine similar shapes to the full. The manufacturing party can describe a DRC rule for detecting design layout patterns liable to manufacturing defects and enable the design stage to easily remove design layout patterns containing line widths and spaces that cannot be manufactured. As a result, the designing party can decrease risks of supplying design layout patterns liable to manufacturing defects.

The simple type can be extracted from a simple repetition of lines and spaces in accordance with the presence or absence of a corner in an adjacent region. The simple type can be extracted from independent hole patterns in accordance with the number of holes in an adjacent region.

The simple type can also be extracted from a design layout pattern containing only one, two, or three sufficiently long lines in accordance with the presence or absence of a corner and the number of lines in an adjacent region.

A process for the simple type can be described analogously to the process for the uninterested type in which the presence or absence of marking is replaced with the above-mentioned extraction of the simple type. A detailed description is therefore omitted.

The above-mentioned flow can remove plainly shaped design layout patterns from the new-type library.

The derived type concerns a set of design layout patterns that are not shaped similarly to design layout patterns contained in the existing-type library 22 but eventually deliver similar manufacturability evaluation results. The design layout patterns in the set are shaped differently from each other but are expected to deliver similar results from the post-OPC verification using OPC/RET.

This can be achieved by applying OPC/RET, actually performing the post-OPC verification, and comparing the results. Processing loads can be reduced by performing simplified versions of OPC/RET and the post-OPC verification that are performed during actual manufacturing.

A process for the derived type will be described with reference to FIG. 16. In the process, the new-type list and the existing-type library 22 include an OPC/RET result and a post-OPC verification result. Either or both the OPC/RET result and the post-OPC verification result may be included.

At step S91, the apparatus initializes the new-type list so as to store these results. The apparatus reads the existing-type library 22 and the design layout 21 (S92). The apparatus determines whether all design layout objects in the design layout 21 are processed (S93).

If all design layout objects have not been processed (NO at step S93), the apparatus selects a design layout object as a process target. The apparatus performs the OPC/RET and the post-OPC verification on the design layout object selected as a target (S94).

The apparatus compares the OPC/RET result and the post-OPC verification result acquired at step S94 with the corresponding results stored in the existing-type library 22. Specifically, the apparatus compares the OPC/RET result as described in the similar type extraction of graphic differences. The post-OPC verification result contains a verification type and an error position. The apparatus compares the post-OPC verification result so as to find differences in terms of the verification type and error position coordinates in the design layout object.

At step S95, the apparatus acquires a difference in the OPC/RET result and differences for the verification type and the error position coordinates in the post-OPC verification result. The apparatus determines match or mismatch based on whether these differences belong to an allowable range (S96). According to the same method, the apparatus compares the OPC/RET result and the post-OPC verification result newly found with the OPC/RET result and the post-OPC verification result already acquired in the new-type list. The apparatus determines match or mismatch based on whether the differences belong to an allowable range (S97).

The apparatus stores the design layout object selected as a target, the OPC/RET result, and the post-OPC verification result in the new-type list (S98). The apparatus outputs the design layout object, the OPC/RET result, and the post-OPC verification result to the new-type library 23 (S99).

Figure 18A:
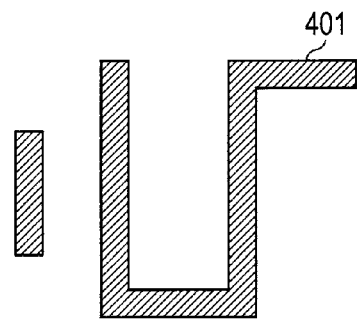
FIGS. 18A through 18F illustrate a method of determining a match or a mismatch in OPC/RET results.
Figure 18B:
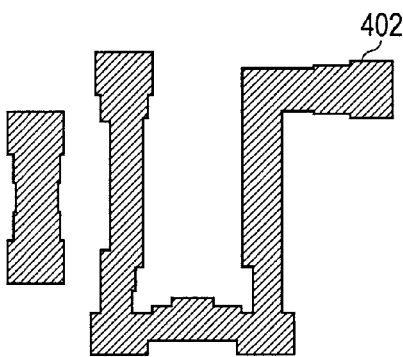
Figure 18C:
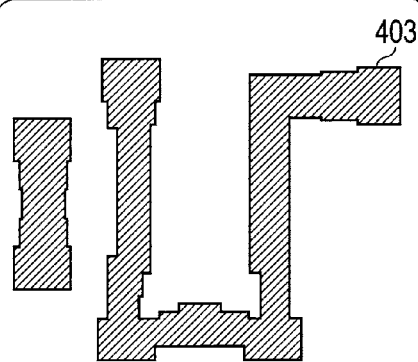
Figure 18D:
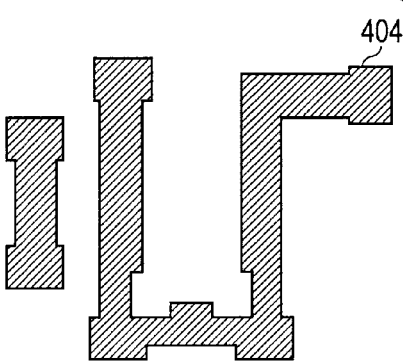

FIGS. 18A through 18F illustrate a method of determining a match or a mismatch in OPC/RET results. FIG. 18A exemplifies a design layout pattern 401. FIGS. 18B through 18D show photomask patterns 402 through 404 generated from the design layout pattern 401 in FIG. 18A to which OPC/RET is applied. The photomask patterns 402 and 403 completely match with each other in terms of the outline shape. The photomask pattern 404 partially differs from these patterns in terms of the outline shape because conditions in adjacent regions differ.

Performing a Boolean operation such as exclusive OR (XOR) on these patterns generates an empty set (no layout pattern output as a result) between the photomask patterns 402 and 403. Performing the same operation between the photomask patterns 404 and 402 or 403 detects only differences. Directly comparing OPC/RET results enables determination between match and mismatch. It is also possible to provide an upper bound region and a lower bound region as shown in FIGS. 14A through 14D and perform comparison based on whether patterns belong to the range.

Figure 18E:
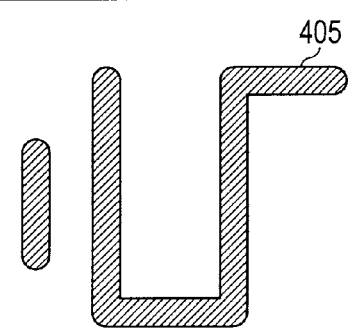
Figure 18F:
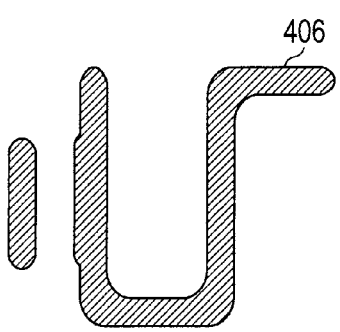

FIG. 18E shows a semiconductor device layout pattern formed on a wafer when the photomask pattern 402 in FIG. 18B is used to manufacture a semiconductor device. Similarly, FIG. 18F shows a semiconductor device layout pattern formed on a wafer when the photomask pattern 404 in FIG. 18D is used to manufacture a semiconductor device.

The following exemplifies pattern dimension verification of lithography verification generally performed as the post-OPC verification. The verification performs lithography simulation, estimates a layout pattern shape of the semiconductor device, and determines manufacturability according to the shape. As seen from the drawings, the layout patterns 405 and 404 differ from each other in the semiconductor device layout pattern shapes.

The verification detects a match if a difference between the pattern shapes (difference between pattern distortions) belongs to an allowable range of values. The verification detects a mismatch if the difference exceeds the range. Even though the design layout patterns do not match, there are finally provided similar semiconductor device layout pattern shapes whose differences are contained in specified regions. The design layout patterns can be assumed to be the same.

Obviously, more precise and efficient determination is available if allowable values for match or mismatch are varied in accordance with importance in circuit operations such as whether the difference corresponds to an active transistor gate.

Multiple design layout objects may deliver similar post-OPC verification results. For example, design layout pattern shapes may match within a specified range. The pattern dimension verification of lithography verification may detect pattern distortion errors within a specified distance. In such a case, a design layout pattern with the largest pattern distortion amount is assumed to be a representative. A design object having the largest effect on manufacturability can be stored as a representative in the new-type library.

FIGS. 19A through 19F illustrate MRC (Mask Rule Check) as an example of post-OPC verification. The MRC verifies the photomask manufacturability based on photomask pattern shapes.

The photomask patterns 402 and 403 as shown in FIGS. 19A through 19D are equivalent to those shown in FIGS. 18B and 18C but contain slight differences in the shapes.

Figure 19A:
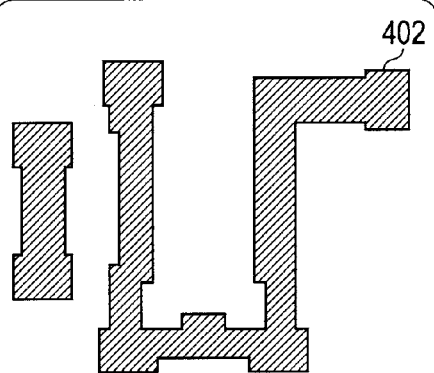
FIGS. 19A through 19F illustrate MRC as an example of post-OPC verification.
Figure 19B:
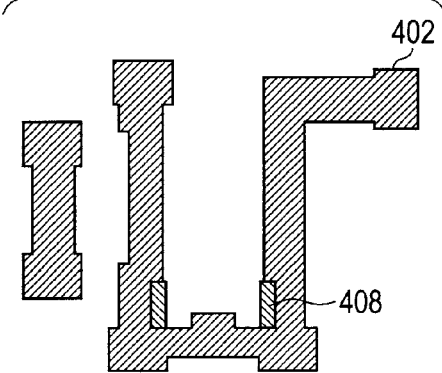
Figure 19C:
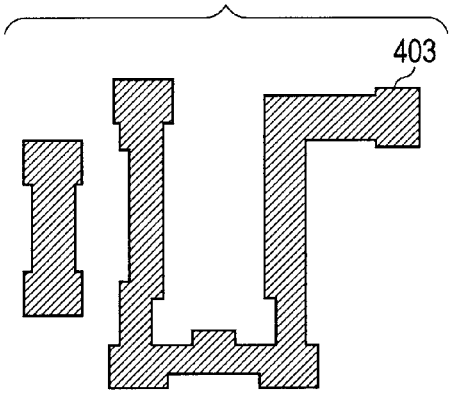
Figure 19D:
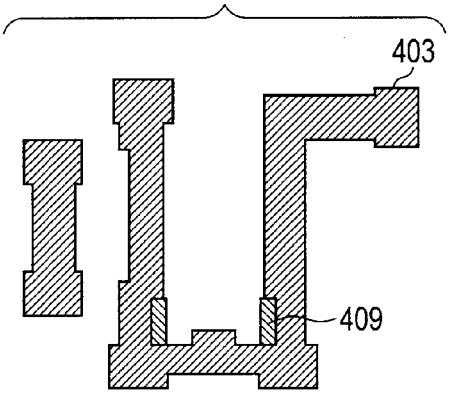

FIGS. 19B and 19D show results 408 and 409 after applying the MRC to the photomask patterns 402 and 403. The verification type provides verification that extracts a photomask pattern as a location liable to a mask manufacturing defect if the photomask pattern is more narrowly and deeply etched than values predetermined for the photomask pattern. Error positions are equally provided with reference to the photomask pattern. The verification results are assumed to match.

Figure 19E:
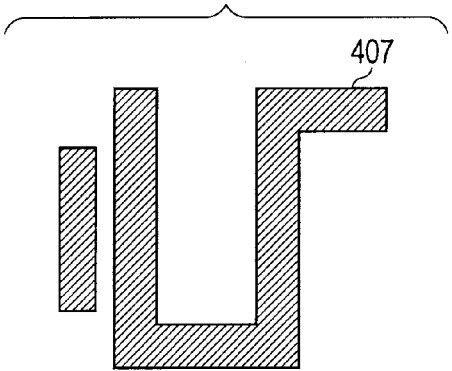
Figure 19F:
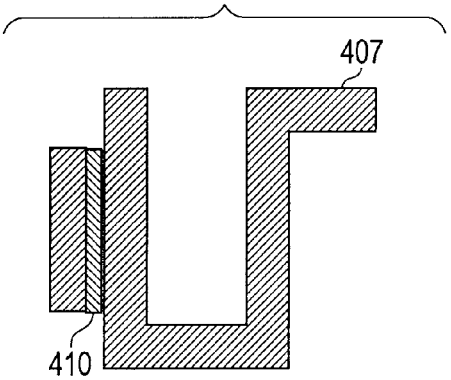

FIG. 19E shows a different photomask pattern 407. FIG. 19F shows a result 410 after applying the MRC to the photomask pattern 407 in FIG. 19E. The photomask pattern 407 contains no groove and therefore does not output any verification type error concerning grooves such as the MRC results 408 and 409. The result differs from the others. Obviously, the error position for the MRC result 410 differs from those for the MRC results 408 and 409.

The above-mentioned process can remove a design layout pattern from the new-type library 23 if the design layout pattern delivers a manufacturability evaluation result similar to those for the design layout patterns contained in the existing-type library 22.

The manufacturable type concerns a set of design layout patterns that are determined to be manufacturable as a result of the OPC/RET and the post-OPC verification. The manufacturing party can determine the manufacturable type to be easily manufacturable without performing the OPC/RET and the post-OPC verification.

The process of the manufacturable type is similar to that of the derived type. A difference is that no design layout pattern is stored in the new-type library 23 if a verification error indicative of a manufacturing difficulty is not detected as a result of the post-OPC verification. A less manufacturable design layout object can be stored in the new-type library 23 as long as the post-OPC verification is performed highly reliably. On the other hand, it is possible to exclude a design layout object from processing targets if the design layout object is undoubtedly easily manufactured.

There may be a case where the existing-type library 22 does not contain a design layout object similar to the manufacturable type and the post-OPC verification is highly reliable. In such a case, a design layout object categorized as the manufacturable type may be stored as a manufacturable design layout in the existing-type library 22.

Generally, removal of the derived type and the manufacturable type requires computer loads and are preferably performed after removal of the other types.

The embodiment can remove unnecessary design layout patterns from the new-type library 23 and efficiently create the new-type library 23 by limiting design layout patterns to new types that originally need to be taken into consideration.

As described above, the embodiment removes unnecessary design layout patterns from the new-type library 23. In addition to the effects described in the first through fifth embodiments, the sixth embodiment can efficiently create the new-type library 23 by limiting design layout patterns to new types that originally need to be taken into consideration.

Seventh Embodiment

The first through sixth embodiments determine subsequent steps based on the presence or absence of the new-type library 23. These embodiments cannot take into consideration the number of design layout objects configuring the new-type library 23 or manufacturability of each design layout pattern all of which actually affect the subsequent steps.

The seventh embodiment of the invention evaluates manufacturability of the new-type library 23.

Figure 20:
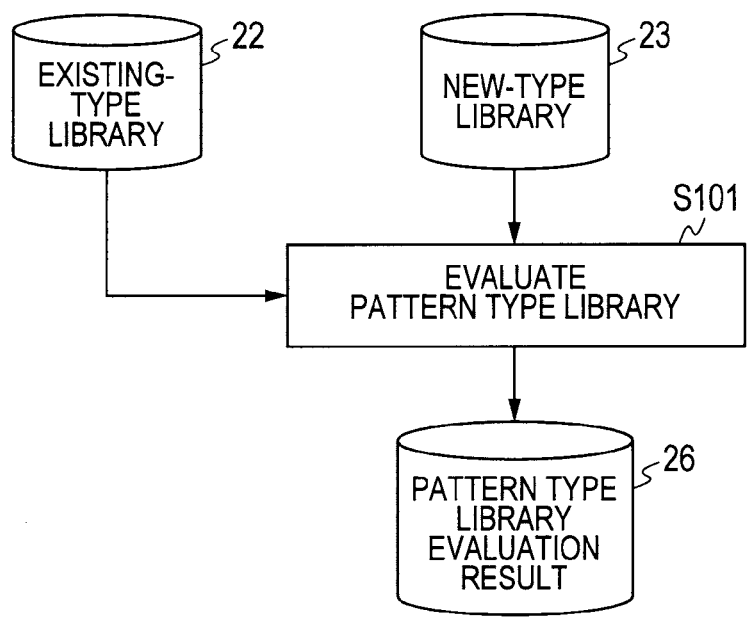
FIG. 20 shows an example of pattern type library evaluation.

FIG. 20 shows an example of pattern type library evaluation. The example evaluates a pattern type library using the new-type library 23 and the existing-type library 22 as inputs and outputs an evaluation result 26 (S101).

Figure 21:
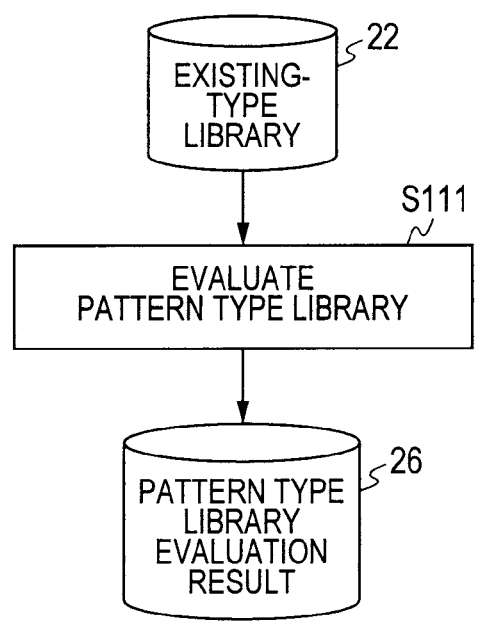
FIG. 21 shows another example of pattern type library evaluation.

FIG. 21 shows another example of pattern type library evaluation. The example evaluates the pattern type library using the existing-type library 22 as an input and outputs the evaluation result 26 (S111).

Figure 22:
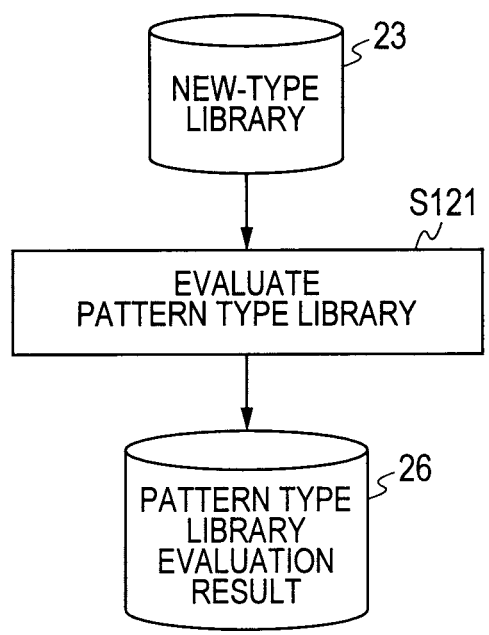
FIG. 22 shows yet another example of pattern type library evaluation.

FIG. 22 shows yet another example of pattern type library evaluation. The example evaluates the pattern type library using the new-type library 23 as an input and outputs the evaluation result 26 (S121).

Figure 23:
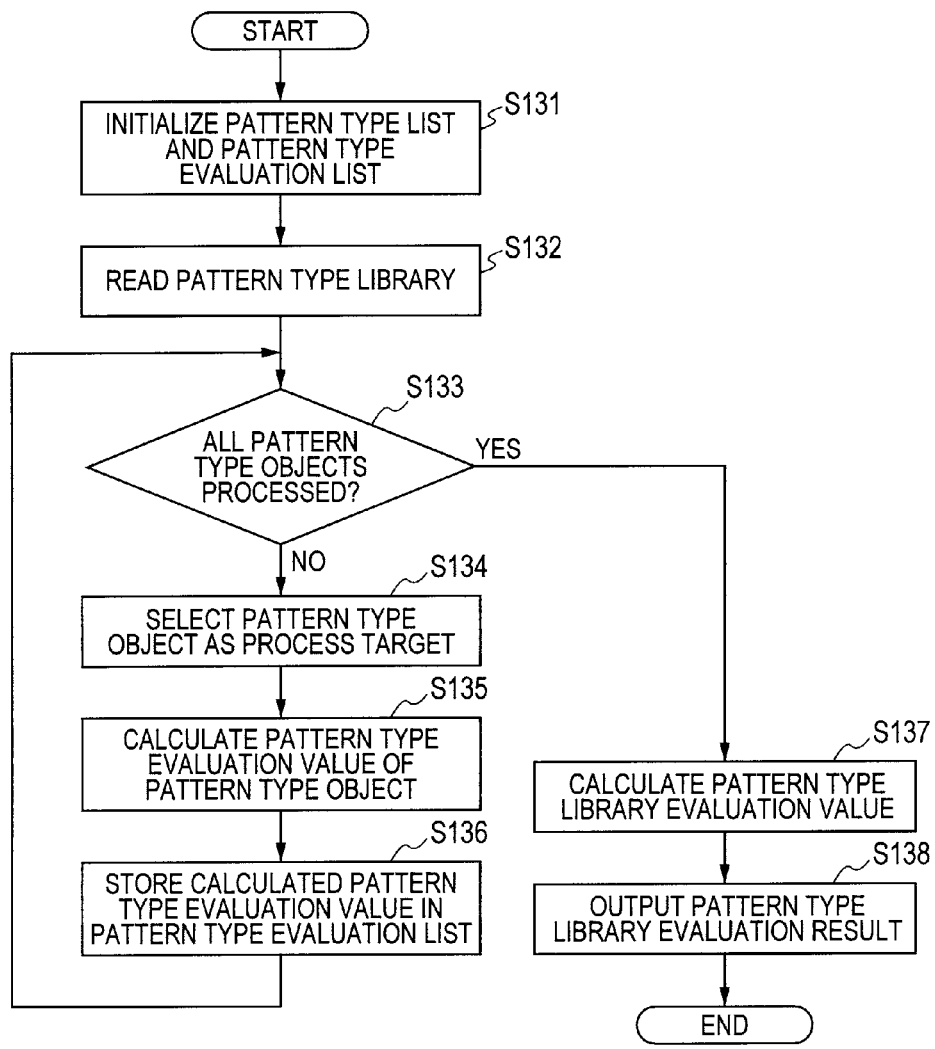
FIG. 23 is a flowchart showing pattern type library evaluation processes shown in FIGS. 20 through 22.

FIG. 23 is a flowchart showing pattern type library evaluation processes shown in FIGS. 20 through 22. The new-type library 23 and the existing-type library 22 are collectively referred to as a pattern type library.

The process initializes a pattern type list and a pattern type evaluation list (S131). The pattern type list temporarily stores a pattern type object included in the pattern type library during the process. The pattern type object may contain a design layout pattern. The pattern type object may contain the core region and the frame in accordance with the other embodiments described above. The pattern type object may contain an OPC/RET result. Further, the pattern type object may contain a post-OPC verification result.

The process reads the pattern type library (S132). The process determines whether all pattern type objects configuring the pattern type library are processed (S133). If all pattern type objects are not processed (NO at step S133), the process selects an unprocessed pattern type object as a process target.

The process calculates a pattern type evaluation value of the selected pattern type object (S135). The pattern type evaluation value will be described in detail later. The process additionally stores the pattern type evaluation value in the pattern type evaluation list (S136), returns to step S133, and repeats the subsequent steps.

If all pattern type objects are processed (YES at step S133), the process calculates a pattern type library evaluation value (S137). The pattern type library evaluation value will be described in detail later. The process outputs the pattern type evaluation value and the pattern type library evaluation value as pattern type library evaluation results (S138) and then terminates.

The following describes the pattern type evaluation value. The pattern type evaluation value indicates an index of manufacturability for the pattern type object. The index may represent the minimum line width, the minimum interval, the number of patterns, the number of vertexes, and pattern density, all of which indicate graphic characteristics of a design layout pattern.

If the new-type library and the existing-type library are read, the pattern type evaluation value may indicate a difference between a set of pattern type objects in the new-type library settled as a target and a set of pattern type objects configuring the existing-type library.

Specifically, the pattern type object settled as a target in the new-type library is compared with each one of all pattern type objects configuring the existing-type library. A pattern type object showing the smallest difference is selected as a difference amount. In this case, the difference can be calculated using a design layout pattern area found by a Boolean operation such as exclusive OR between graphics as described above. The difference can also be calculated as that found between manufacturability indexes for pattern type objects as described above. The difference may be found between OPC/RET results if these are contained in pattern type objects in the pattern type library.

The manufacturability index may be represented as severity of post-OPC verification results if these are contained in pattern type objects in the pattern type library. For example, the following equation calculates error count $E_{coef}$ weighted by the severity for verification types.

$$E_{coef} = \Sigma(V_i \times E_i) \quad (1)$$

where $V_i$ denotes the weight according to the severity for verification type i; and $E_i$ denotes the number of errors occurred for verification type i.

Even the same verification types compliant with different error standards are assumed to be different verification types. For example, the following equation calculates $EV_{coef}$, a difference in pattern size shift lengths.

$$EV_{coef} = \Sigma(V_i \times wV_{ij} \times E_{ij}) \quad (2)$$

where $wV_{ij}$ denotes the weight for error standard j of verification type i; and $E_{ij}$ denotes the number of errors for error standard j of verification type i. An error standard function may replace $wV_{ij}$.

For example, verification type 1 may represent a pattern shift for the lithograph verification. The error standard may be equivalent to pattern distortion δ, that is, a difference between the semiconductor device pattern dimension found by lithography simulation and the pattern dimension expected in the design and specified in the design layout 21. In this case, $EV_{coef}$ may be calculated as follows.

$$wV_{1j} = f(\delta) = k_1 \times \delta \quad (3)$$

where f( ) denotes the function for converting error standard δ into $wV_{ij}$; and $k_1$ as a function example denotes the proportional constant for converting error standard δ into the verification type, that is, error severity $wV_{1j}$ for the error standard.

The following describes the pattern type library evaluation value. The pattern type library evaluation value indicates a manufacturability index for an entire set of pattern type objects configuring the pattern type library.

The pattern type library evaluation value may represent the number of pattern type objects. The pattern type library evaluation value may also represent a static value for pattern type evaluation values such as average, dispersion, standard deviation, maximum value, or minimum value.

The pattern type evaluation value may be output in terms of each of design layout patterns or objects in the pattern type library. For example, the pattern type evaluation value may represent frequency distribution of minimum line widths or may represent a distribution chart that plots a minimum line width and a minimum interval as (x, y) on a graph.

Generally, an OPC/RET development load increases as the pattern type library stores an increasing number of representative design layout objects. The number of design layout objects may be used as the pattern type library evaluation value in order to calculate the development load.

The design layout may be added as an input when the pattern type library is evaluated. The design layout 21 is evaluated using an index indicating the number of design layout patterns that are stored in the design layout and match design layout objects in a new library. The index may be used for semiconductor device manufacturing yields. The following equation calculates the number of design layout patterns Nnl in the design layout corresponding to those in the new-type library.

$$Nnl = \Sigma(Ndo_i) \quad (4)$$

where $Ndo_i$ denotes the number of design layout patterns that are stored in the design layout and correspond to design layout objects in the new library. In this case, the correspondence obviously takes into consideration the similar type, the derived type, and so on as described above.

Consequently, the embodiment can evaluate the number of design layout patterns that configure the new-type library and affect the subsequent steps, that is, the diversity or the manufacturability of respective design layout patterns.

For example, the embodiment can estimate loads on manufacturing and development and thereby provide more fine-tuned manufacturing control and business incentives to more preferable delivery deadline and prices.

Eighth Embodiment

The eighth embodiment provides the design layout verification apparatus and the mask data verification apparatus described in the first through seventh embodiments using the pattern matching technology and the existing EDA tool. The pattern matching technology is used to extract a design layout pattern region that matches predetermined design layout patterns.

Figure 24:
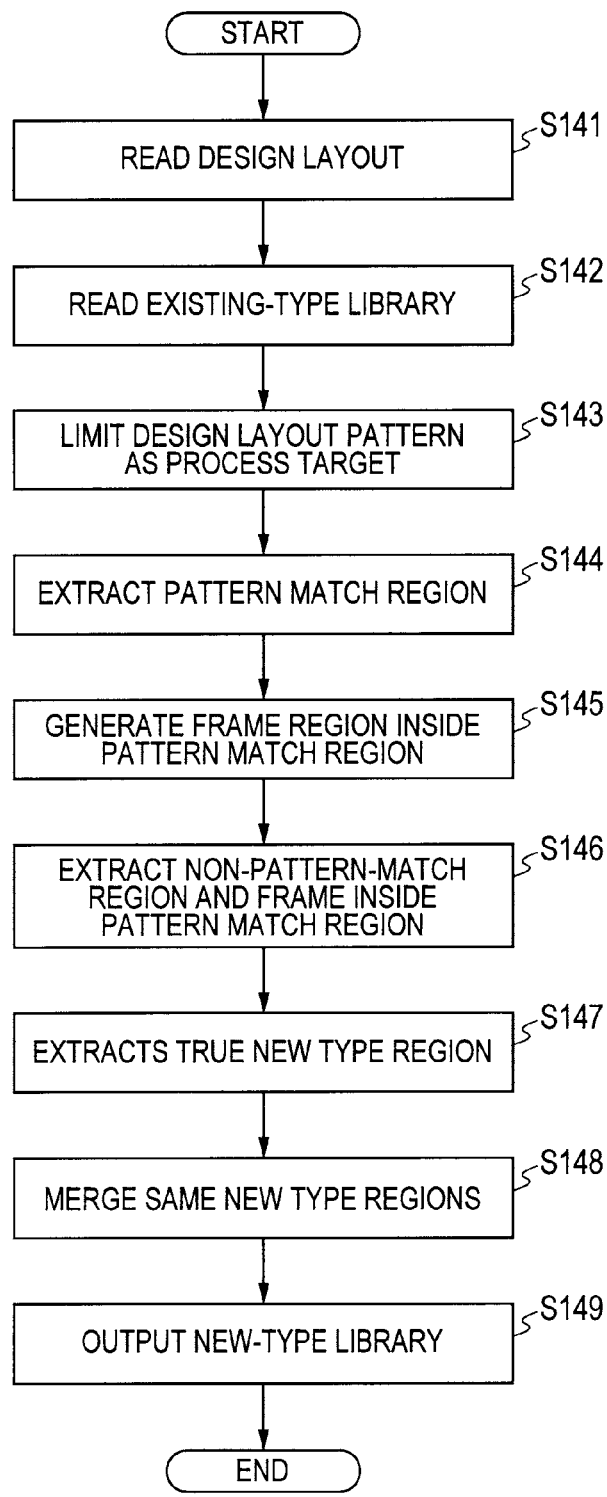
FIG. 24 is a flowchart showing a new-type library extraction method according to an eighth embodiment of the invention.

FIG. 24 is a flowchart showing a new-type library extraction method according to the eighth embodiment of the invention. FIGS. 25A through 25H show changes in a design layout and design layout patterns resulting from processes. The following describes the new-type library extraction method according to the embodiment with reference to FIGS. 24 through 25H.

Figure 25A:
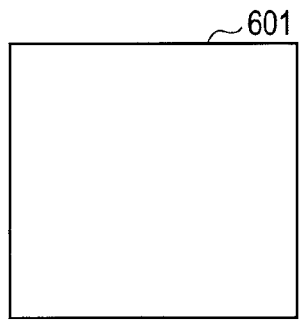
FIGS. 25A through 25H show changes in a design layout and design layout patterns resulting from processes.

The method reads the design layout 21 (S141). FIG. 25A shows all or part 601 of the design layout. The layout contains a design layout pattern that configures the semiconductor device.

The method reads the existing-type library 22 (S142). The existing-type library is described above and may comply with any format available for the pattern matching technology.

Figure 25B:
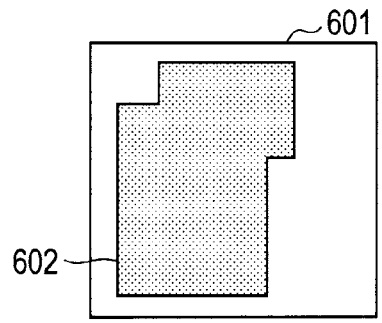

The method limits design layout patterns as process targets in accordance with design layout pattern attributes (e.g., layer numbers) or region specifications based on coordinates. The method thereby removes an uninterested type. FIG. 25B shows a resulting design layout pattern region 602 as a process target.

Figure 25C:
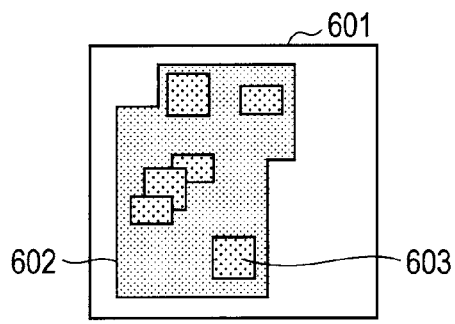

The method extracts a pattern match region using the pattern matching technology (S144). The method extracts a design layout pattern matching the existing-type library from the design layout pattern region 602 as a process target. FIG. 25C shows a region 603 containing the extracted design layout pattern.

The method generates a frame region inside the pattern match region 603 (S145). The frame region is described above. The embodiment removes the pattern match region 603 from the design layout pattern 602 as a process target and uses the resulting design layout pattern for the OPC/RET development.

Figure 25D:
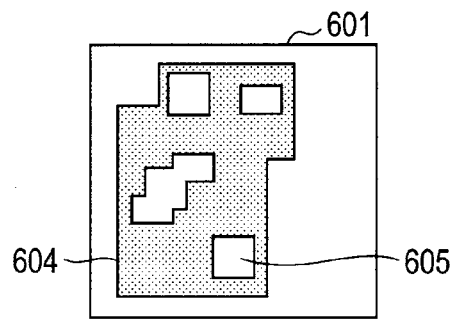

FIG. 25D shows a non-pattern-match region 604 formed by removing (logical NOT as a graphic process) the pattern match region from the design layout pattern 602 as a process target. The design layout pattern corresponding to a region 605 is removed.

Figure 25E:
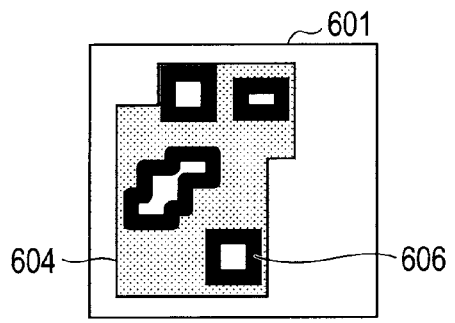

As described above, however, the OPC/RET needs to take the proximity effect into consideration. The non-pattern-match region 604 alone is insufficient as a finally extracted design layout pattern. A frame needs to be ensured inside the pattern match region 603. FIG. 25E shows a frame region 606 inside the pattern match region 603.

Figure 25F:
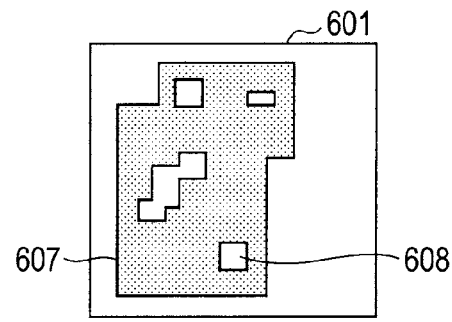

The method adds (logical OR as a graphic process) a frame region inside pattern match region 606 to the non-pattern-match region 604 to form a non-pattern-match region 607 containing the frame (S146). FIG. 25F shows the non-pattern-match region 607 containing the frame.

The logical OR as a graphic process may be performed simply as described above in the other embodiments or may be performed by separating the core region and the frame in order to identify them. A region 608 is formed by removing the frame region inside pattern match region 606 from the pattern match region 603.

It may be possible to use the non-pattern-match region 607 formed at step S146 containing the frame. For preferable processing efficiency, however, processes to be described later are performed to remove the similar type, the simple type, and the derived type.

Figure 25G:
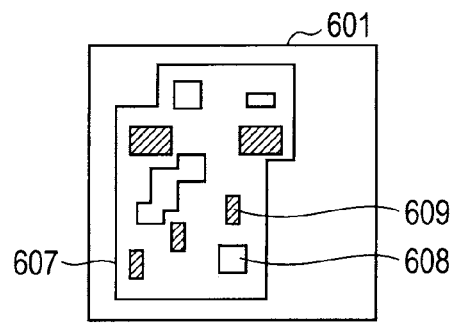

Based on the non-pattern-match region 607 containing the frame, the method extracts a true new type region including the new type that should be originally taken into consideration (S147). The method removes the simple type and the other types as described above. FIG. 25G shows a true new type region 609 formed inside the region 607. Various methods can be used to remove the simple type and the other types. As an example, the following describes removal of the simple type using a DRC tool.

Figure 26A:
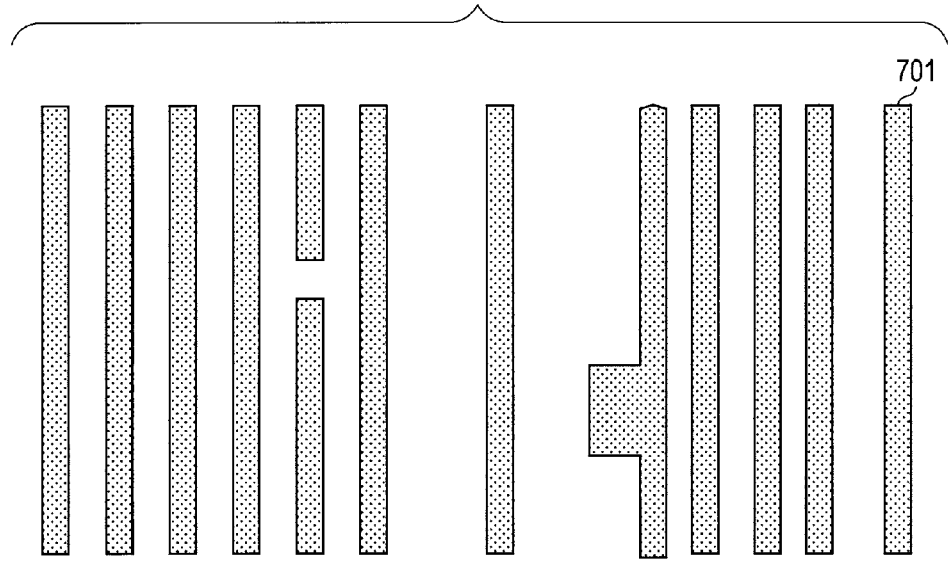
FIGS. 26A and 26B show removal of a line-and-space pattern belonging to a simple type using a DRC tool (part 1 of 2)
Figure 26B:
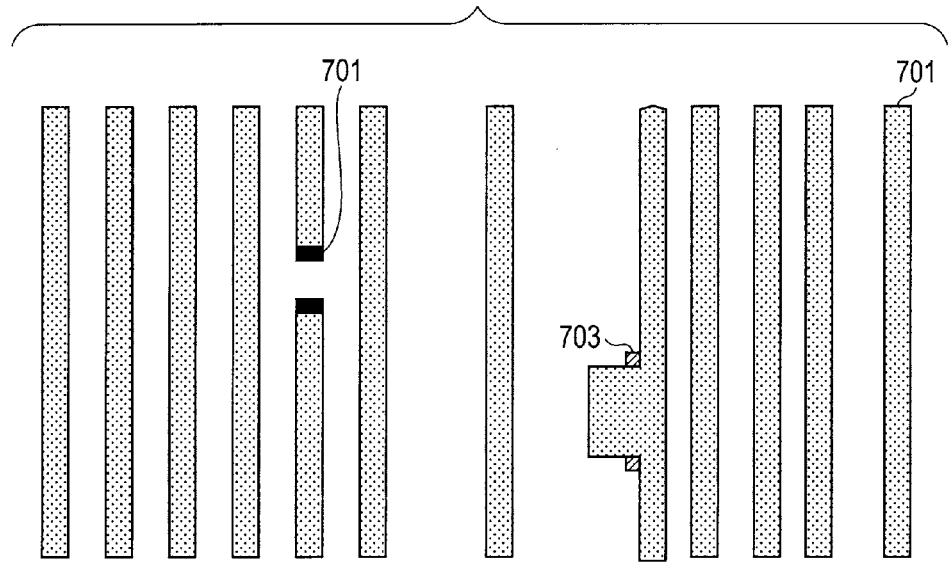

FIGS. 26A, 26B, 27A, and 27B show examples of removing a line-and-space simple type (simple repetition of lines and spaces) using the DRC tool. FIG. 26A shows a design layout pattern 701 as input to the process. FIG. 26B shows that general functions of the DRC tool are used to extract locations 702 and 703 not included in the simple type.

The location 702 is a marker provided where a side having a specified length or more and another shorter side are coupled at a projecting right angle and both sides approximate to each other at a distance shorter than a specified distance. The location 703 is a marker provided for a recessed corner.

Figure 27A:
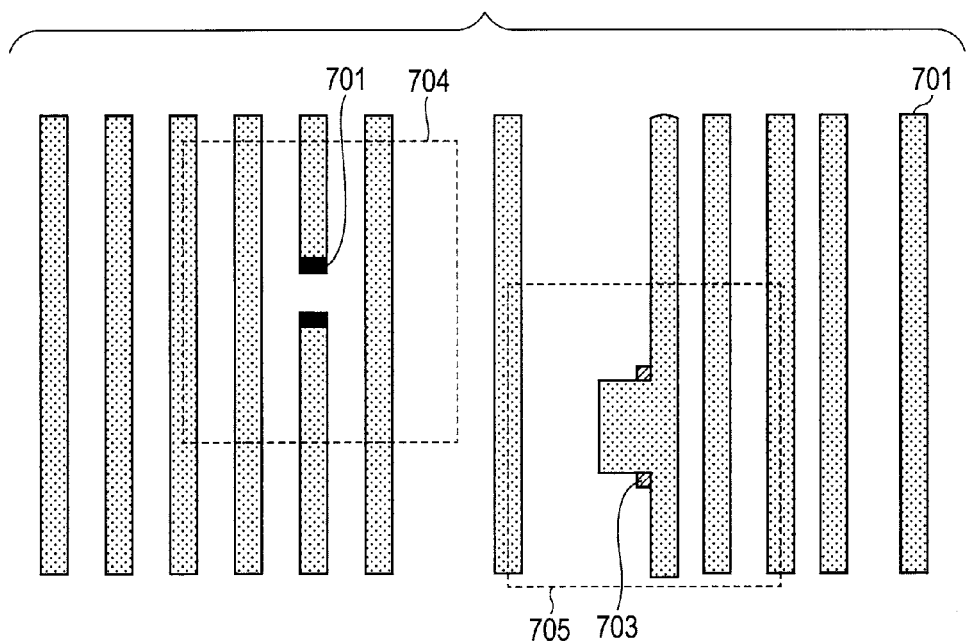
FIGS. 27A and 27B show removal of a line-and-space pattern belonging to a simple type using a DRC tool (part 2 of 2)

The DRC tool can be used to extract corners in the design layout pattern and extract a region expanded to a specified size or oversized so as to include the corners. This enables to extract a region containing nearby corners, that is, a region that is not line-and-space. FIG. 27A shows regions 704 and 705 that are expanded with reference to the locations 702 and 703 and are assumed to be ranges subject to the proximity effect and OPC.

Figure 27B:
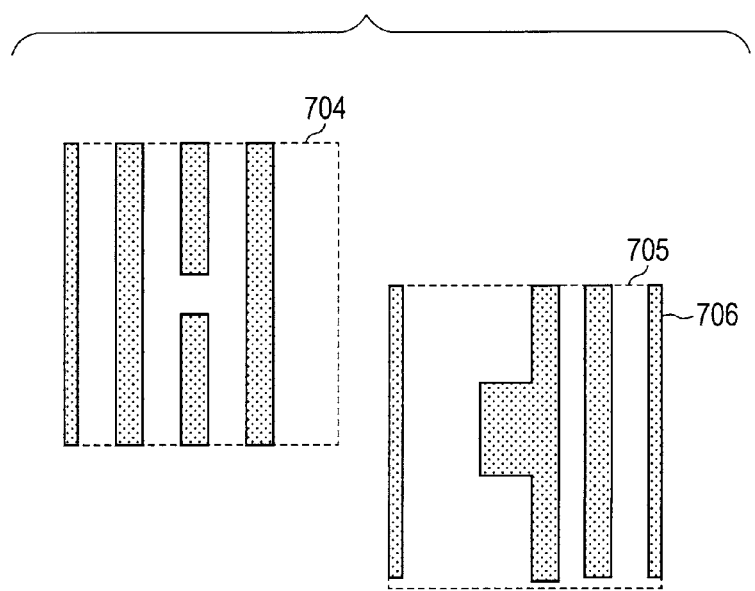

FIG. 27B shows a result of removing the simple type from the design layout pattern 701 by assuming that regions other than the regions 704 and 705 belong to the simple type. In this manner, the DRC tool may be used to remove the simple type.

Figure 25H:
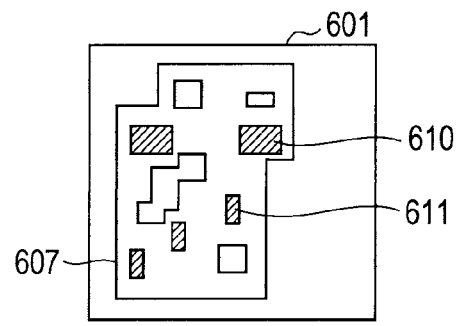

The method merges the same new type regions (S148). The method performs pattern matching within the extracted true new type region 609 and separates matching regions from the others. FIG. 25H shows a result. The new type region 609 is separated into two true new types 610 and 611 independent of each other.

The result at step S148 is available as distribution of quantities and positions of the independent true new types in the design layout. A region or a design module containing new types in the design layout pattern can also be checked for the distribution of independent true new types. To improve the development, it is desirable to perform the next process step to acquire the new-type library. The method finally outputs the new-type library (S149).

Figure 28A:
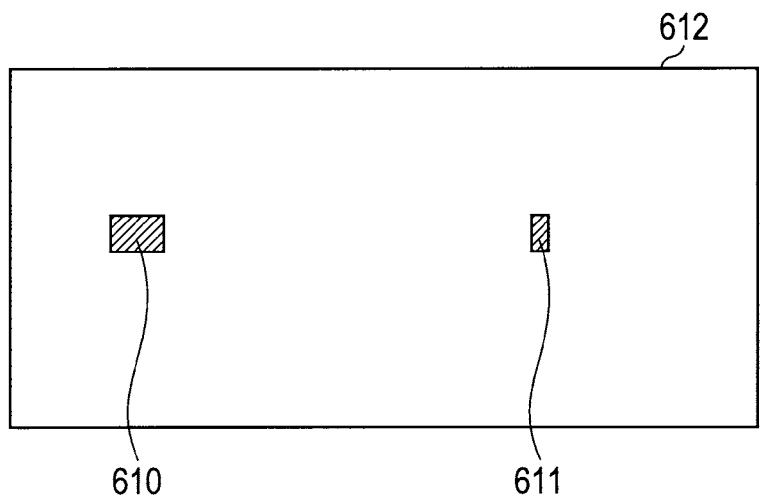
FIGS. 28A and 28B exemplify new-type libraries.
Figure 28B:
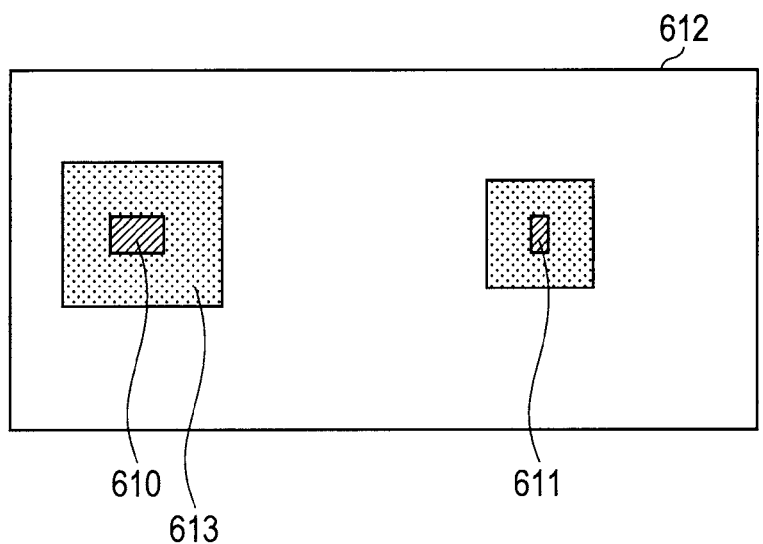

FIGS. 28A and 28B exemplify new-type libraries. In FIG. 28A, a pattern 612 is equivalent to a design layout configuring the new-type library. Specifically, the pattern 612 can be described in the GDSII Calma stream format or the OASIS format. The patterns 610 and 611 result from FIG. 25H and are positioned at a distance or in a form that prevents the patterns from interfering with each other. As described above, the new-type library configuration is not limited to this example.

In FIG. 28B, the new-type library is used to generate test data for the OPC/RET development. A region 613 supplies test data. The region 613 surrounds the patterns 610 and 611 to provide a design layout pattern or the same design layout object around the patterns in order to simulate surrounding conditions expected on an actual design layout. The region 613 can be used to avoid an erratic OPC/RET process or a pseudo error of the post-OPC verification that may occur on the outer edges of the patterns 610 and 611.

Obviously, the similar effect is available if the process steps in FIG. 24 are partially removed or replaced with the others. The configuration of the embodiment is similar to that described in the other embodiments. The embodiment can be combined with the other embodiments or can partially replace them.

Figure 29:
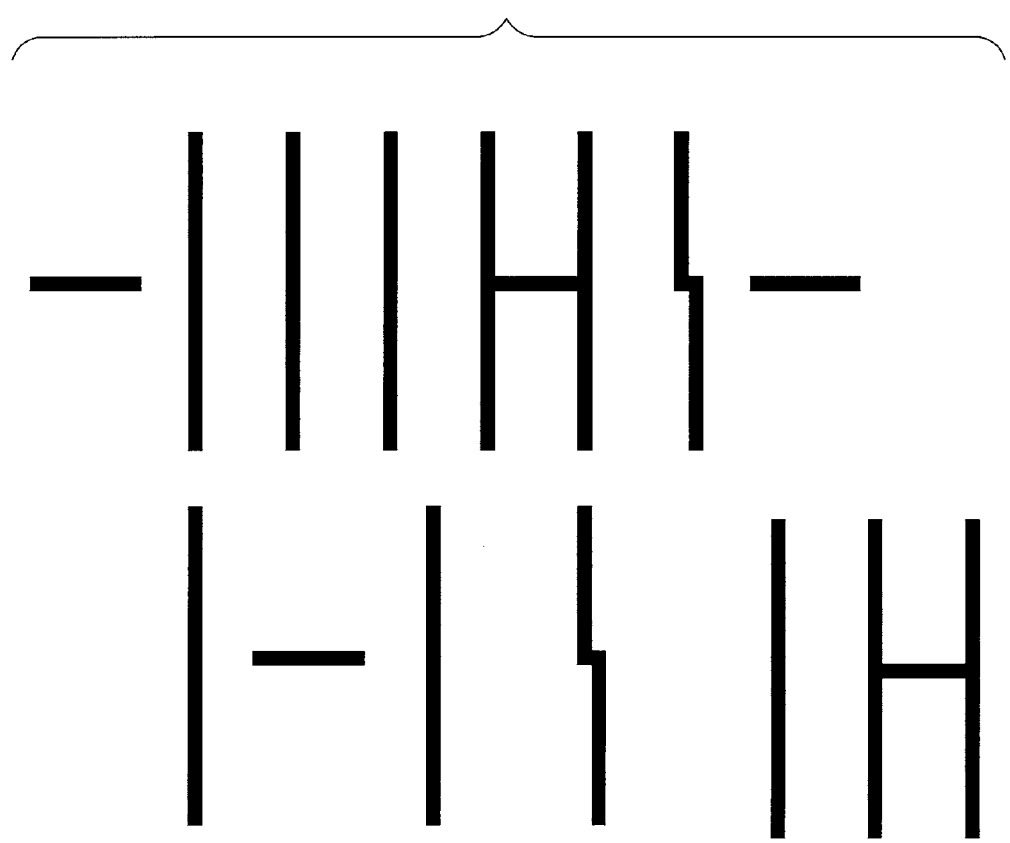
FIG. 29 exemplifies a design layout 21.
Figure 30:
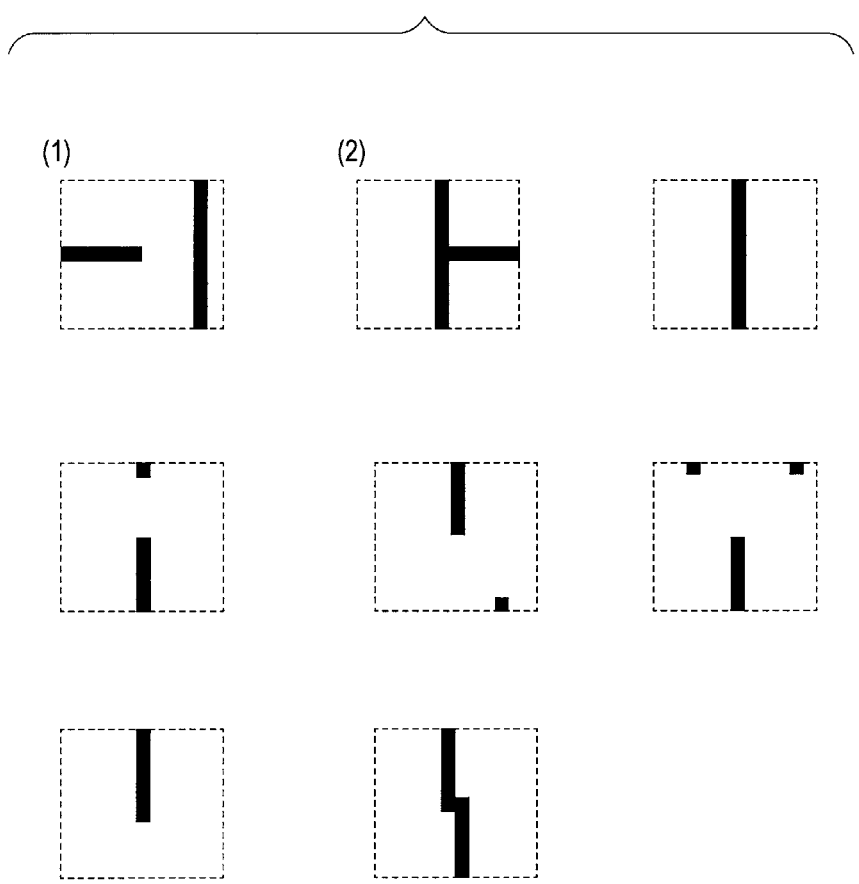
FIG. 30 exemplifies an existing-type library 22.

FIGS. 29 through 34A and 34B exemplify new types extracted by according to the eighth embodiment of the invention. FIG. 29 exemplifies the design layout 21. FIG. 30 exemplifies the existing-type library 22. FIG. 30 omits the frame region for simplicity.

Figure 31:
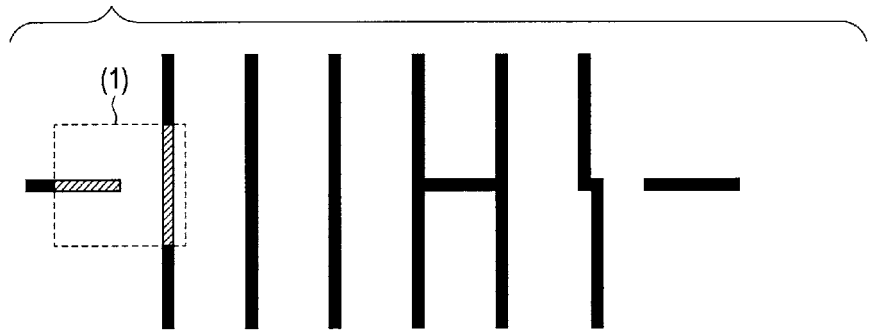
FIG. 31 shows pattern matching from the top left of the design layout 21 shown in FIG. 29.
Figure 31:
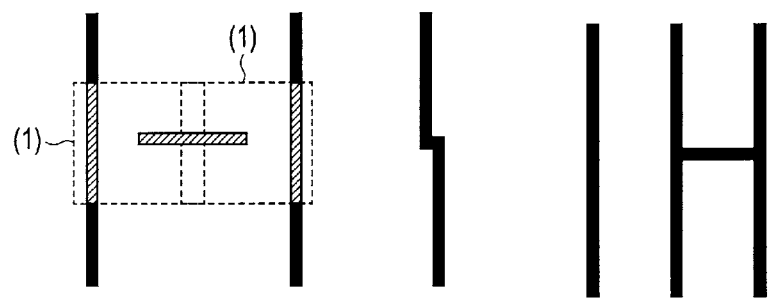

FIG. 31 shows pattern matching from the top left of the design layout 21 shown in FIG. 29. From the top left of the design layout 21, a region of the same size as the existing-type library is settled as the pattern match region. For example, the region is shifted to the right one dot at a time for pattern matching with the existing-type library. When the matching is complete at the right end, the region is shifted down one row in order to start the scan from the right end.

FIG. 31 shows that three regions (1) indicated by dotted lines match the existing-type library (1) in FIG. 30. The existing-type library can be rotated or inverted. The bottom left region (1) indicated by dotted line in FIG. 31 matches a 180-degree rotated version of the existing-type library (1) shown in FIG. 30.

Figure 32:
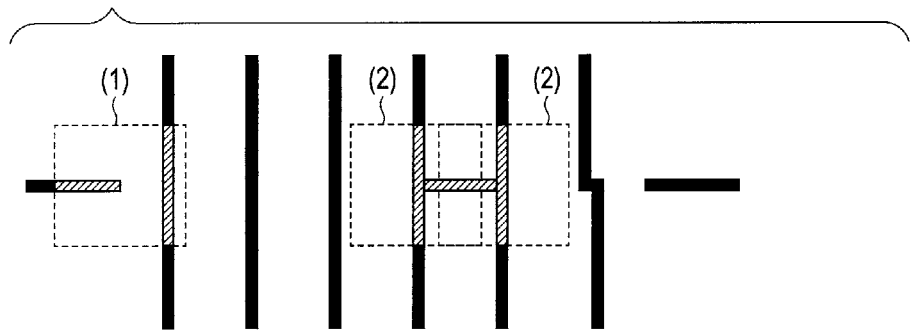
FIG. 32 shows matches with existing-type libraries (1) and (2) shown in FIG. 30.
Figure 32:
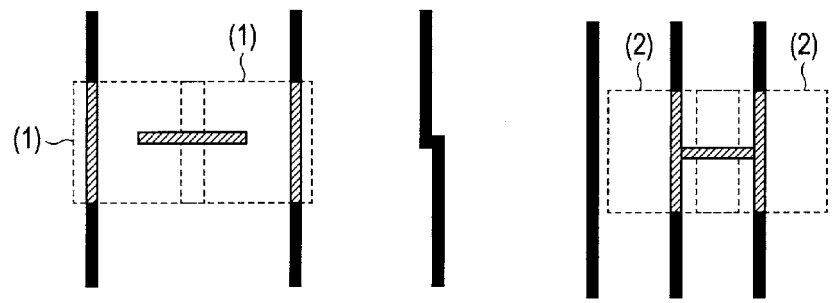

FIG. 32 shows that the design layout additionally matches the existing-type library (2) in FIG. 30. Regions (2) indicated by dotted lines in FIG. 32 match the existing-type library (2) shown in FIG. 30.

Figure 33:
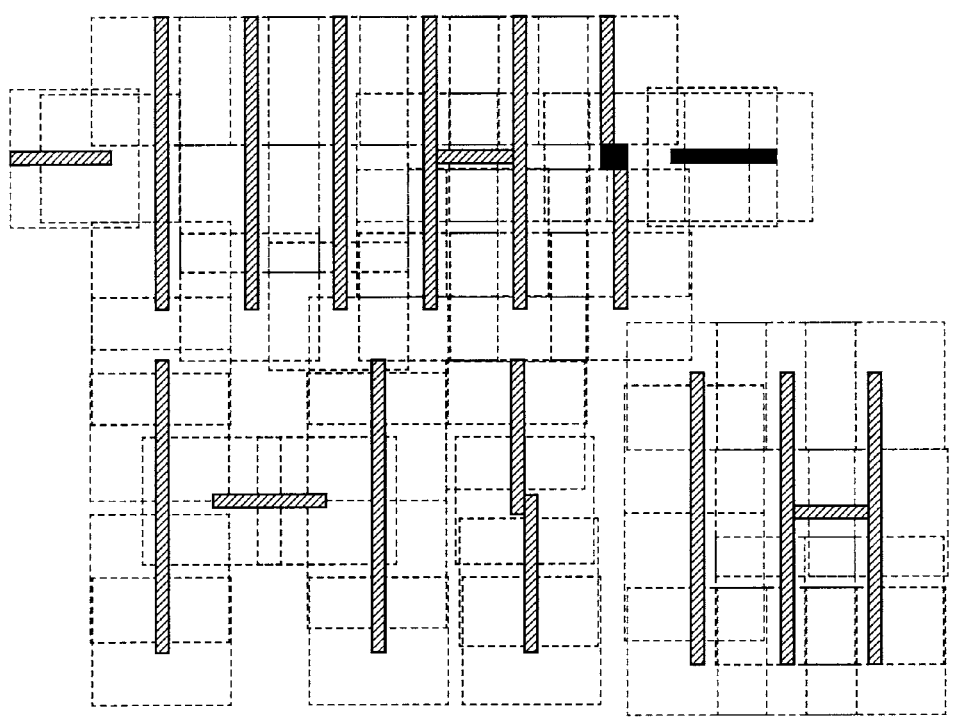
FIG. 33 shows finally remaining patterns that are excluded from the pattern matching.

Patterns are successively matched with the existing-type libraries shown in FIG. 30. The matched design layout patterns are successively removed. FIG. 33 shows finally remaining patterns that are excluded from the pattern matching.

Figure 34A:
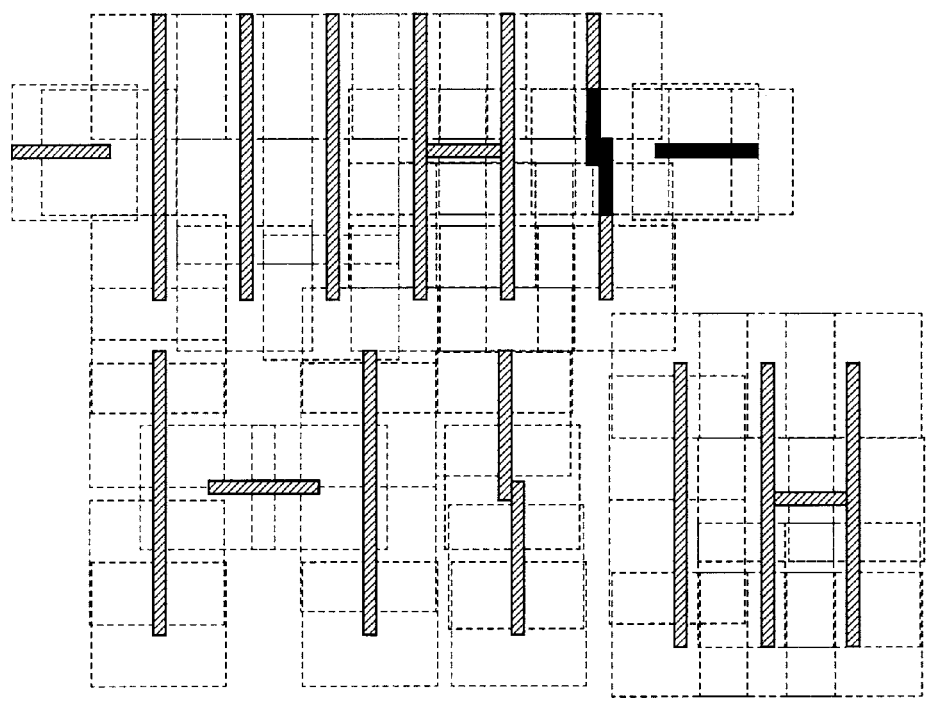
FIGS. 34A and 34B show additional regions needed for the finally remaining patterns.
Figure 34B:
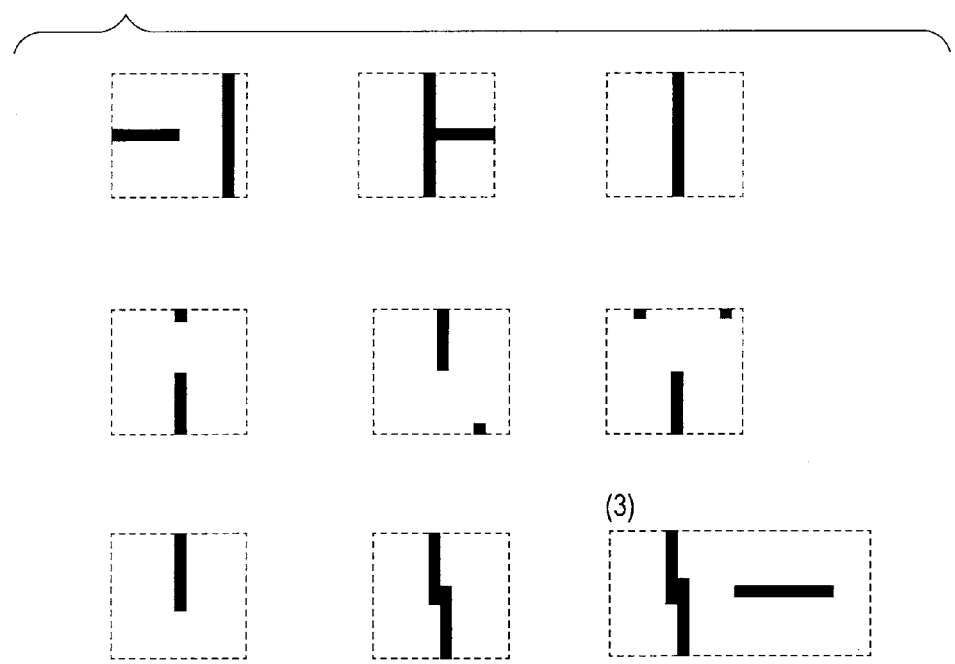

FIGS. 34A and 34B show additional regions needed for the finally remaining patterns. FIG. 34A shows that the shaded design layout patterns are all removed and a pattern indicated by thick lines is extracted as the new type. FIG. 34B shows that a new-type pattern (3) is added.

As described above, the embodiment can use the existing EDA tool to extract design layout patterns not belonging to the presupposed design layout patterns and ensure efficient OPC/RET development.

All the disclosed embodiments just provide examples and must be considered to be nonrestrictive. Accordingly, the scope of the present invention is defined by the appended claims rather than the foregoing description and the exemplary embodiments described therein. Various modifications may be made without departing from the spirit or scope of the general inventive concept as defined by the appended claims and their equivalents.

What is claimed is:

1. A mask data verification apparatus that verifies mask data created using optical proximity correction and a resolution enhancement technology with reference to a design layout created at a designing party, the apparatus comprising:

an existing-type library that stores design layout patterns proven to be free from manufacturing defects according to past manufacturing results;

a new type extraction part that compares the design layout with design layout patterns stored in the existing-type library, extracts only a design layout pattern found to be neither equal nor similar to the design layer patterns stored in the existing-type library as a new-type design layout pattern, and stores the new-type design layout pattern in a new-type library different from the existing-type library and not including the design layout patterns proven to be free from manufacturing defects according to past manufacturing results, the new-type library including both design layout patterns which have manufacturing defects and design layout patterns not having manufacturing defects; and a verification part that creates mask data for a new-type design layout pattern stored in the new-type library using the optical proximity correction and the resolution enhancement technology and performs post-verification.

2. The mask data verification apparatus according to claim 1, further comprising a library update part that adds a new-type design layout pattern to the existing-type library when the verification part determines the new-type design layout pattern to be manufacturable.

3. The mask data verification apparatus according to claim 1, wherein the existing-type library stores information indicating a range similar to a design layout pattern proven to be free from manufacturing defects; and wherein the new type extraction part references the information indicating a similar range, the information being stored in the existing-type library, and extracts a design layout pattern found to be neither equal nor similar to the design layer patterns stored in the existing-type library as a new-type design layout pattern.

4. The mask data verification apparatus according to claim 1, further comprising a library evaluation part that outputs a library evaluation value equivalent to a difference quantity between a design layout pattern stored in the existing-type library and a new-type design layout pattern stored in the new-type library.

5. The mask data verification apparatus according to claim 1, wherein the new type extraction part sequentially performs pattern matching with reference to the design layout using each of design layout patterns stored in the existing-type library, repeats pattern matching while removing a matched location in the design layout, and determines a finally remaining location to be the new-type design layout pattern.

6. A design layout verification apparatus that creates and verifies a design layout, the apparatus comprising:

a design layout generation part that generates the design layout from a logic circuit;

an existing-type library that stores design layout patterns proven to be free from manufacturing defects according to past manufacturing results; and a new type extraction part that compares the design layout with design layout patterns stored in the existing-type library, extracts only a design layout pattern found to be neither equal nor similar to the design layer patterns stored in the existing-type library as a new-type design layout pattern, and stores the new-type design layout pattern in a new-type library different from the existing-type library and not including the design layout patterns proven to be free from manufacturing defects according to past manufacturing results, the new-type library including both design layout patterns which have manufacturing defects and design layout patterns not having manufacturing defects.

7. The design layout verification apparatus according to claim 6, further comprising a library update part that accepts a new-type design layout pattern being stored in the new-type library and being determined to be manufacturable at a manufacturing party and adds the new-type design layout pattern to the existing-type library.

8. The design layout verification apparatus according to claim 6, wherein the new type extraction part sequentially performs pattern matching with reference to the design layout using each of design layout patterns stored in the existing-type library, repeats pattern matching while removing a matched location in the design layout, and determines a finally remaining location to be the new-type design layout pattern.

9. A mask data verification method that allows a computer to verify mask data created using optical proximity correction and a resolution enhancement technology with reference to a design layout created at a designing party, the method comprising the steps of:

allowing the computer to compare the design layout with design layout patterns proven to be free from manufacturing defects according to past manufacturing results and stored in an existing-type library, extract only a design layout pattern found to be neither equal nor similar to the design layer patterns stored in the existing-type library as a new-type design layout pattern, and stores the new-type design layout pattern in a new-type library different from the existing-type library and not including the design layout patterns proven to be free from manufacturing defects according to past manufacturing results, the new-type library including both design layout patterns which have manufacturing defects and design layout patterns not having manufacturing defects; and allowing the computer to create mask data for a new-type design layout pattern stored in the new-type library using the optical proximity correction and the resolution enhancement technology and to perform post-verification.

10. A design layout verification method that allows a computer to create and verify a design layout, the method comprising the steps of:

allowing the computer to generate the design layout from a logic circuit; and allowing the computer to compare the design layout with design layout patterns proven to be free from manufacturing defects according to past manufacturing results and stored in an existing-type library, extract only a design layout pattern found to be neither equal nor similar to the design layer patterns stored in the existing-type library as a new-type design layout pattern, and stores the new-type design layout pattern in a new-type library different from the existing-type library and not including the design layout patterns proven to be free from manufacturing defects according to past manufacturing results, the new-type library including both design layout patterns which have manufacturing defects and design layout patterns not having manufacturing defects.

11. A non-transitory computer readable medium storing a computer program that allows a computer to verify mask data created using optical proximity correction and a resolution enhancement technology with reference to a design layout created at a designing party, which when executed by the computer, causes the computer to perform steps comprising:

allowing the computer to compare the design layout with design layout patterns proven to be free from manufacturing defects according to past manufacturing results and stored in an existing-type library, extract only a design layout pattern found to be neither equal nor similar to the design layer patterns stored in the existing-type library as a new-type design layout pattern, and stores the new-type design layout pattern in a new-type library different from the existing-type library and not including the design layout patterns proven to be free from manufacturing defects according to past manufacturing results, the new-type library including both design layout patterns which have manufacturing defects and design layout patterns not having manufacturing defects; and allowing the computer to create mask data for a new-type design layout pattern stored in the new-type library using the optical proximity correction and the resolution enhancement technology and to perform post-verification.

12. A non-transitory computer readable medium storing a computer program that allows a computer to create and verify a design layout, which when executed by the computer, causes the computer to perform steps comprising:

allowing the computer to generate the design layout from a logic circuit; and allowing the computer to compare the design layout with design layout patterns proven to be free from manufacturing defects according to past manufacturing results and in an existing-type library, extract only a design layout pattern found to be neither equal nor similar to the design layer patterns stored in the existing-type library as a new-type design layout pattern, and stores the new-type design layout pattern in a new-type library different from the existing-type library and not including the design layout patterns proven to be free from manufacturing defects according to past manufacturing result, the new-type library including both design layout patterns which have manufacturing defects and design layout patterns not having manufacturing defects.

* * * * *